United States Patent
Choi et al.

(10) Patent No.: US 11,417,809 B2
(45) Date of Patent: Aug. 16, 2022

(54) LIGHT EMITTING DISPLAY APPARATUS

(71) Applicant: LG Display Co., Ltd., Seoul (KR)

(72) Inventors: Mingeun Choi, Paju-si (KR); KeumKyu Min, Paju-si (KR); Soyoung Jo, Paju-si (KR); Yonghoon Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 170 days.

(21) Appl. No.: 16/716,388

(22) Filed: Dec. 16, 2019

(65) Prior Publication Data

US 2020/0212275 A1  Jul. 2, 2020

(30) Foreign Application Priority Data

Dec. 26, 2018 (KR) .......................... 10-2018-0169922

(51) Int. Cl.
| | | |
|---|---|---|
| *H01L 33/58* | (2010.01) | |
| *H01L 33/50* | (2010.01) | |
| *H01L 25/075* | (2006.01) | |
| *H01L 33/38* | (2010.01) | |

(52) U.S. Cl.
CPC .......... *H01L 33/58* (2013.01); *H01L 25/0753* (2013.01); *H01L 33/382* (2013.01); *H01L 33/502* (2013.01)

(58) Field of Classification Search
None
See application file for complete search history.

(56) References Cited

U.S. PATENT DOCUMENTS

| | | | | |
|---|---|---|---|---|
| 7,903,055 | B2 * | 3/2011 | Nishikawa | H05B 33/22 345/77 |
| 8,368,617 | B2 * | 2/2013 | Asaki | H01L 51/5203 345/76 |
| 2006/0125374 | A1 * | 6/2006 | Ito | H01J 29/864 313/292 |
| 2011/0012139 | A1 | 1/2011 | Yamamoto | |
| 2014/0346449 | A1 * | 11/2014 | Choi | H01L 51/5268 257/40 |
| 2015/0380466 | A1 * | 12/2015 | Koo | H01L 51/5275 257/40 |
| 2016/0234943 | A1 * | 8/2016 | Chung | H05K 1/09 |
| 2016/0285029 | A1 * | 9/2016 | Jeon | H01L 51/0054 |
| 2018/0190719 | A1 * | 7/2018 | Kim | H01L 27/326 |
| 2018/0247980 | A1 * | 8/2018 | Jang | H01L 27/3258 |

FOREIGN PATENT DOCUMENTS

KR  10-2011-0008191 A  1/2011

* cited by examiner

*Primary Examiner* — Su C Kim
(74) *Attorney, Agent, or Firm* — Seed IP Law Group LLP

(57) ABSTRACT

A light emitting display apparatus is disclosed, which can improve light extraction efficiency of light emitted from a light emitting diode. The light emitting display apparatus comprises a substrate including a plurality of pixel areas having an opening area, an uneven portion arranged in the opening area, and a light emitting diode arranged over the uneven portion, the uneven portion may have roughness average value of about 0.19 to about 0.29 for a unit size.

20 Claims, 8 Drawing Sheets

LIGHT EMITTING DISPLAY APPARATUS

CROSS-REFERENCE TO RELATED APPLICATIONS

This application claims the benefit of the Korean Patent Application No. 10-2018-0169922 filed on Dec. 26, 2018, which is hereby incorporated by reference as if fully set forth herein.

BACKGROUND

Technical Field

The present disclosure relates to a light emitting display apparatus.

Description of the Related Art

A light emitting display apparatus has a high response speed, low power consumption, and is a self-light emitting display apparatus without using a particular light source unlike a liquid crystal display apparatus, the light emitting display device does not cause a problem in a viewing angle and thus attracts attention as a next-generation flat panel display device.

A light emitting display device displays an image by emission of light from light emitting elements including a light emitting layer interposed between two electrodes. In this case, light generated by emission of light from the light emitting elements is externally discharged through the electrodes, a substrate, and the like.

BRIEF SUMMARY

However, in such a light emitting display device, some light of light emitted from a light emitting layer is not externally discharged due to total reflection or the like at an interface between the light emitting layer and an electrode and/or an interface between the substrate and an air layer, whereby light extraction efficiency is reduced. For example, in a general light emitting display apparatus, about 80% of light emitted from the light emitting layer is confined inside without being emitted (or extracted) to the outside, and about 20% of light may be extracted to the outside.

Therefore, the general light emitting display device has problems in that luminance is deteriorated and power consumption is increased due to low light extraction efficiency.

In some embodiments, the present disclosure is provides a light emitting display apparatus that can improve light extraction efficiency of light emitted from a light emitting diode.

Additional embodiments and features of the present disclosure will be clearly understood by those skilled in the art from the following description of the present disclosure.

In some embodiments, the present disclosure provides the provision of a light emitting display apparatus comprising a substrate including a plurality of pixel areas having an opening area, that corresponds to a light emitting area, an uneven portion arranged in the opening area, and a light emitting diode arranged over the uneven portion, the uneven portion may have roughness average of about 0.19 to about 0.29 for a unit size.

In some embodiments, the present disclosure provides a light emitting display apparatus comprising an overcoat layer provided over a substrate and including an uneven portion having a plurality of protruding portions, a first electrode provided over the uneven portion, a light emitting layer provided over the first electrode, and a second electrode provided over the light emitting layer, the uneven portion may have roughness skewness of about −0.2 to about 0.43 for a unit size.

In some embodiments, the present disclosure provides a light emitting display apparatus comprising a substrate including a plurality of pixel areas having an opening area that corresponds to a light emitting area, an overcoat layer provided in the opening area and having an uneven portion including a plurality of concave portions spaced apart from each other and a plurality of protruding portions among the plurality of concave portions, a first electrode provided over the uneven portion, a light emitting layer provided over the first electrode, and a second electrode provided over the light emitting layer, the uneven portion may have at least one of roughness average of about 0.19 to about 0.29 and roughness skewness of about −0.2 to about 0.43 for a unit size.

According to the light emitting display apparatus of the present disclosure, light extraction efficiency of light emitted from the light emitting diode may be improved, whereby luminance may be improved and power consumption may be reduced.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
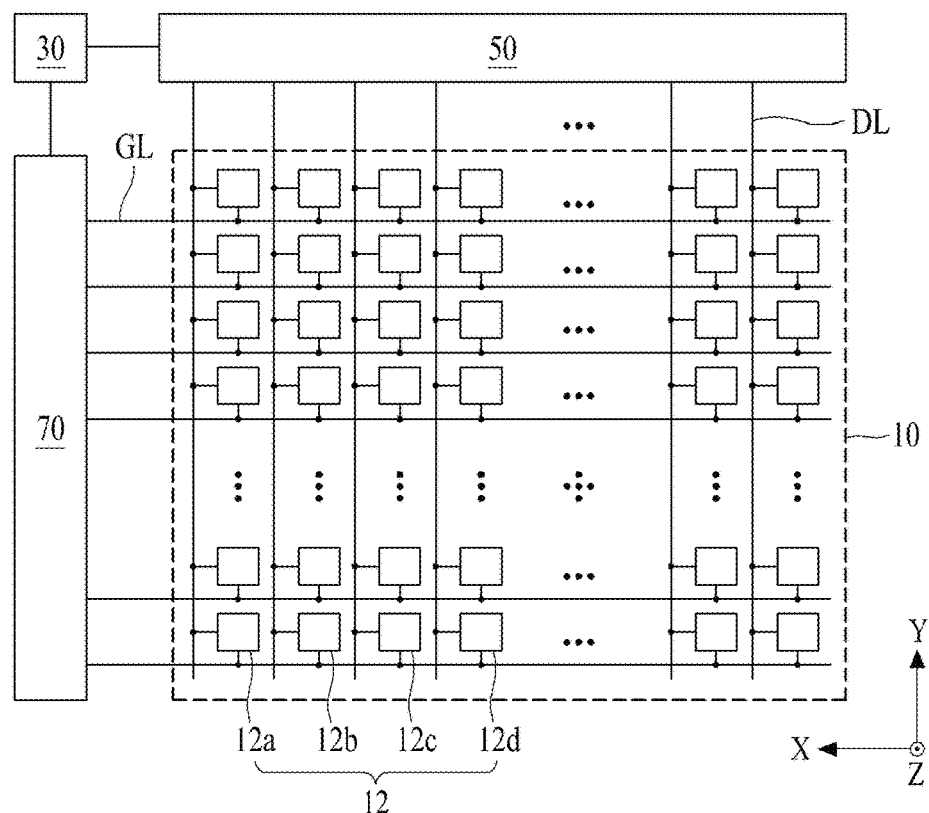
FIG. 1 is a view briefly illustrating a light emitting display apparatus according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

A "first horizontal-axis direction", "second horizontal-axis direction" and "vertical-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a light emitting display apparatus according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a view briefly illustrating a light emitting display apparatus according to the present disclosure.

Referring to FIG. 1, the light emitting display apparatus according to the present disclosure may comprise a pixel array portion 10, a control circuit 30, a data driving circuit 50, and a gate driving circuit 70.

The pixel array portion 10 includes a plurality of gate lines GL and a plurality of data lines DL provided over a substrate, and a plurality of pixels 12a, 12b, 12c, and 12d formed in a pixel area defined by the plurality of gate lines GL and the plurality of data lines DL.

Each of the plurality of pixels 12a, 12b, 12c, and 12d displays images in accordance with gate signals supplied from the gate lines GL neighboring thereto and data signals supplied from the data lines DL neighboring thereto.

Each of the plurality of pixels 12a, 12b, 12c, and 12d according to one example includes a pixel circuit provided in the pixel area and a light emitting diode connected to the pixel circuit.

The pixel circuit may include at least two thin-film transistors and at least one capacitor.

The light emitting diode may include a self-light emitting diode for displaying an image through self-light emission in accordance with the data signals provided from the pixel circuit. In this case, the self-light emitting diode may be an organic light emitting diode, a quantum-dot light emitting diode, or an inorganic light emitting diode.

Each of the plurality of pixels 12a, 12b, 12c, and 12d may be defined as an area of a minimum unit from which light is actually emitted and may be referred to as a subpixel. In this case, at least three pixels neighboring to each other can constitute a unit pixel 12 for displaying a color image.

One unit pixel 12 according to some embodiments may include three pixels 12a, 12b, and 12c that are arranged neighboring to each other in the longitudinal direction of the corresponding gate line GL or include four pixels 12a, 12b, 12c, and 12d that are arranged neighboring to each other in the longitudinal direction of the corresponding gate line GL. For example, a first pixel 12a may be a red pixel, a second pixel 12b may be a green pixel, a third pixel 12c may be a blue pixel, and a fourth pixel 12d may be a white pixel. The light emitting elements of the first to third pixels 12a, 12b, and 12c may emit light of different colors or may emit white light. When the light emitting elements of the first to third pixels 12a, 12b, and 12c emit white light, the first to third pixels 12a, 12b, and 12c include different wavelength conversion layers (or color filter layers) that convert white light into light of different colors. The light emitting element of the fourth pixel 12d may emit white light. In this case, the fourth pixel 12d may not include a wavelength conversion layer (or a color filter layer) or may include the same wavelength conversion layer (or color filter layer) as one of the first to third pixels 12a, 12b, and 12c.

One unit pixel 12 according to another embodiment may include first to fourth pixels 12a, 12b, 12c, and 12d that are arranged neighboring to each other in the longitudinal direction of the corresponding data line DL. In such a unit pixel 12, the number of gate lines GL connected to the gate driver circuit 70 having a relatively simple circuit configuration increases, but the number of data lines DL connected to the data driver circuit 50 having a relatively complicated circuit configuration decreases.

The control circuit 30 generates pixel data corresponding to a plurality of pixels 12a, 12b, 12c, and 12d on the basis of an image signal. The control circuit 30 according to some embodiments may extract white pixel data on the basis of an image signal, that is, red input data, green input data, and blue input data of the unit pixel 12, calculate red pixel data, green pixel data, and blue pixel data by respectively reflecting offset data based on the extracted white pixel data in red input data, green input data and blue input data, and align the calculated red pixel data, green pixel data, and blue pixel data and the white pixel data to correspond to a pixel array structure, and supply the aligned data to the data driver circuit 50.

The control circuit 30 generates a data control signal on the basis of a timing synchronization signal and supplies the generated data control signal to the data driver circuit 50. The control circuit 30 generates a gate control signal on the basis of the timing synchronization signal and supplies the generated gate control signal to the gate driver circuit 70.

The data driver circuit 50 may be connected to a plurality of data lines DL which are provided in the pixel array unit 10. The data driver circuit 50 receives the pixel data and the data control signal which are supplied from the control circuit 30 and receives a plurality of reference gamma voltages which are supplied from a power supply circuit. The data driver circuit 50 converts the pixel data into an analog pixel data signal using the data control signal and the plurality of reference gamma voltages and supplies the analog pixel data signal to the corresponding data lines DL.

The gate driver circuit 70 may be connected to a plurality of gate lines GL which are provided in the pixel array unit 10. The gate driver circuit 70 generates a gate signal in a predetermined sequence on the basis of the gate control signal which is supplied from the control circuit 30 and supplies the generated gate signal to the corresponding gate lines GL.

The gate driver circuit 70 according to some embodiments may be integrated at one edge or both edges of the substrate through a process of manufacturing a thin-film transistor and be connected to the plurality of gate lines GL in a one-to-one correspondence manner. The gate driver circuit 70 according to another embodiment may be configured as an integrated circuit and mounted at the substrate or may be mounted at a flexible circuit film and connected to the plurality of gate lines GL in a one-to-one correspondence manner.

Figure 2:
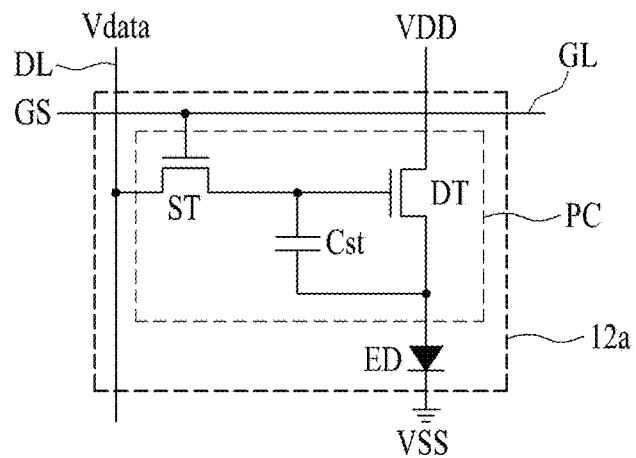
FIG. 2 is an equivalent circuit view illustrating a first pixel shown in FIG. 1.

FIG. 2 is an equivalent circuit diagram illustrating the first pixel illustrated in FIG. 1.

Referring to FIG. 2, the first pixel 12a of the light emitting display apparatus according to one example includes a pixel circuit PC and a light emitting diode or light emitting element ED.

The pixel circuit PC may be provided in a circuit area in a pixel area which is defined by the corresponding gate line GL and the corresponding data line DL and is connected to the corresponding gate line GL, the corresponding data line DL, and a first driving power supply VDD. The pixel circuit PC controls emission of light from the light emitting element ED in accordance with a data signal Vdata from the data line DL in response to a gate-on signal GS from the gate line GL.

The pixel circuit PC according to one example includes a switching thin-film transistor ST, a driving thin-film transistor DT, and a capacitor Cst.

The switching thin-film transistor ST may include a gate electrode that is connected to the corresponding gate line GL, a first source/drain electrode that is connected to the corresponding data line DL, and a second source/drain electrode that is connected to the gate electrode of the driving thin-film transistor DT. The switching thin-film transistor ST is turned on in accordance with a gate-on signal GS supplied to the gate line GL and supplies the data signal Vdata supplied to the data line DL to the gate electrode of the driving thin-film transistor DT.

The driving thin-film transistor DT may include a gate electrode that is connected to the second source/drain electrode of the switching thin-film transistor ST, a drain electrode that is connected to the first driving power supply VDD, and a source electrode that is connected to the light emitting element ED. The driving thin-film transistor DT is turned on in accordance with a gate-source voltage based on the data signal Vdata supplied from the switching thin-film transistor ST and controls a current (or a data current) which is supplied from the first driving power supply VDD to the light emitting element ED.

The capacitor Cst may be connected between the gate electrode and the source electrode of the driving thin-film transistor DT, stores a voltage corresponding to the data signal Vdata supplied to the gate electrode of the driving thin-film transistor DT, and turns on the driving thin-film transistor DT with the stored voltage. At this time, the capacitor Cst can maintain the turned-on state of the driving thin-film transistor DT until a new data signal Vdata is supplied via the switching thin-film transistor ST in a next frame.

The light emitting diode ED may be provided in a light emitting area (or an opening area) in the pixel area and emits light in accordance with a current supplied from the pixel circuit PC.

The light emitting element ED according to some embodiments may include a first electrode that is connected to the source electrode of the driving thin-film transistor DT, a second electrode that is connected to a second driving power supply VSS, and a light emitting layer that is provided between the first electrode and the second electrode. For example, the light emitting layer may include one of an organic light emitting layer, an inorganic light emitting layer, and a quantum-dot light emitting layer or include a stacked or mixed structure of an organic light emitting layer (or an inorganic light emitting layer) and a quantum-dot light emitting layer.

The first pixel 12a of the light emitting display apparatus according to this embodiment displays a predetermined image by causing the light emitting element ED to emit light in accordance with a current corresponding to the data signal Vdata. Similarly, the second to fourth pixels 12b, 12c, and 12d have substantially the same configuration as the first pixel 12a and thus description thereof will not be repeated.

In addition, the pixel circuit PC may include at least one sampling thin-film transistor that samples a characteristic value of the driving thin-film transistor DT and stores the sampled characteristic value in the capacitor Cst and may further include at least one initialization thin-film transistor that initializes the voltage of the capacitor Cst. The pixel circuit PC may further include a sensing thin-film transistor that transmits the characteristic value of the driving thin-film transistor DT and/or a characteristic value of the light emitting element ED to an external sensing circuit. As a result, a known pixel circuit of a light emitting display apparatus may be applied as the pixel circuit PC according to the present disclosure.

Figure 3:
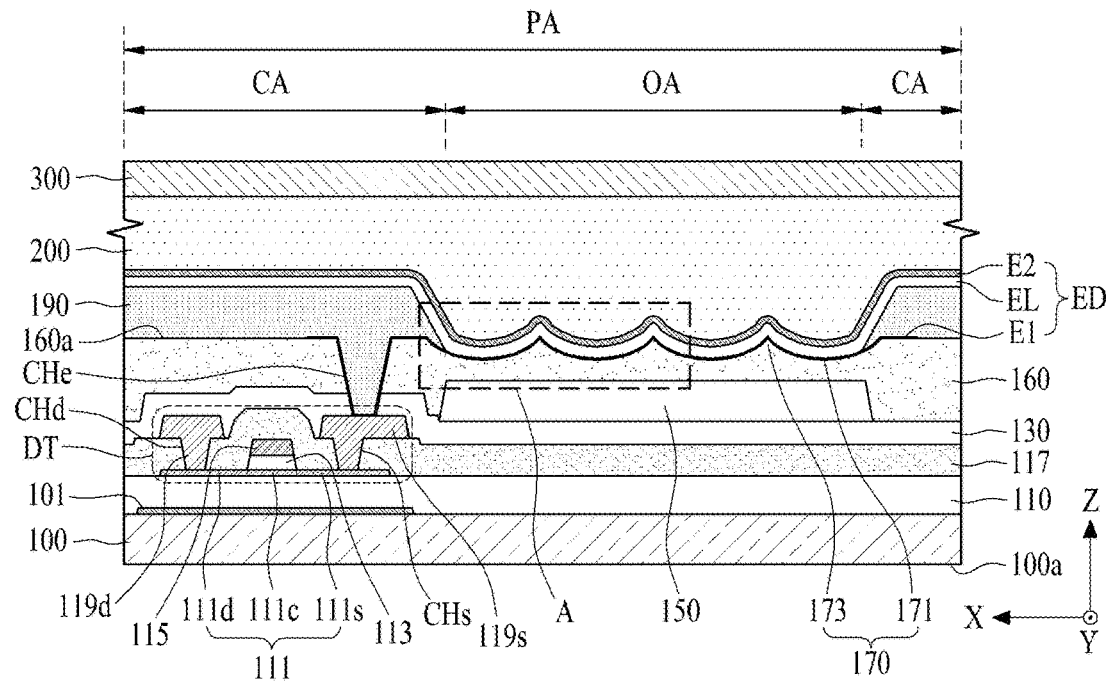
FIG. 3 is a cross-sectional view illustrating a pixel according to one embodiment of the present disclosure.
Figure 4:
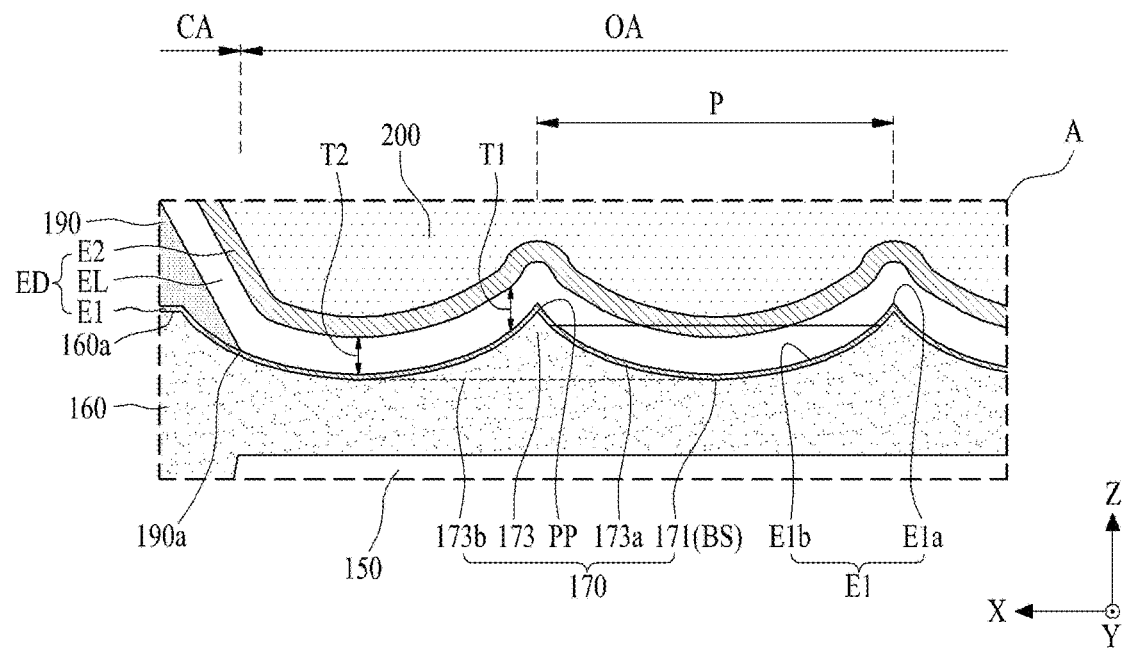
FIG. 4 is an enlarged view illustrating a portion A shown in FIG. 3.
Figure 5:
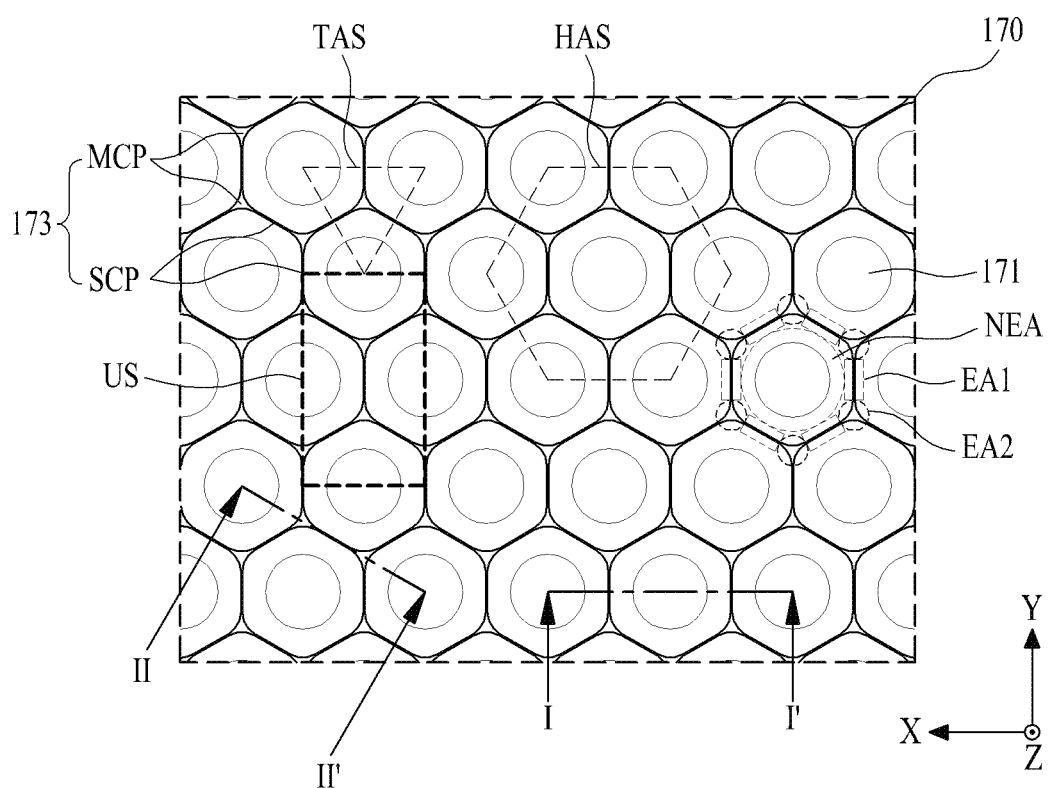
FIG. 5 is a plane view illustrating a flat structure of an uneven portion shown in FIG. 3.

FIG. 3 is a cross-sectional view illustrating a pixel according to one embodiment of the present disclosure, FIG. 4 is an enlarged view illustrating a portion A shown in FIG. 3, and FIG. 5 is a plane view illustrating a flat structure (or a planar structure) of an uneven portion shown in FIG. 3.

Referring to FIGS. 3 to 5, the pixel according to one embodiment of the present disclosure may include a substrate 100, and a pixel area PA provided over the substrate 100.

The substrate 100 may be mainly formed of a glass material, but may be formed of a transparent plastic material such as polyimide that may be bent or curved. When a plastic material is used as the material of the substrate 100, a high-temperature deposition process is performed over the substrate 100 and thus polyimide having excellent heat resistance that can stand at a high temperature may be used. However, the material of the substrate 100 is not limited thereto. The overall front surface of the substrate 100 may be overlaid with one or more buffer layers 110.

The buffer layer 110 serves to prevent materials included in the substrate 100 from diffusing into a transistor layer in a high-temperature process of the process of manufacturing a thin-film transistor. The buffer layer 110 can also serve to prevent external water or moisture from permeating the light emitting element. The buffer layer 110 may be formed of silicon oxide or silicon nitride. Selectively, the buffer layer 110 may be omitted in some cases.

The pixel area PA may include a circuit area CA (or non-opening area) and an opening area OA (namely, a light emission area).

The circuit area CA includes a transistor layer, a protective layer 130, and an overcoat layer 160.

The transistor layer may include a pixel circuit including a driving thin-film transistor DT.

The driving thin-film transistor DT according to some embodiments may include an active layer 111, a gate insulating film 113, a gate electrode 115, an interlayer insulating film 117, a drain electrode 119d, and a source electrode 119s.

The active layer 111 includes a channel region 111c, a drain region 111d, and a source region 111s that are formed in a driving thin-film transistor area of the circuit area CA defined over the substrate 100 or the buffer layer 110. The drain region 111d and the source region 111s may be separated to be parallel to each other with the channel region 111c interposed therebetween.

The active layer 111 according to some embodiments may be formed of a semiconductor material including one of amorphous silicon, polycrystalline silicon, an oxide, and an organic material, but is not limited thereto. For example, the active layer 111 according to the present disclosure may be formed of an oxide such as a Zinc Oxide, a Tin Oxide, a Ga—In—Zn Oxide, an In—Zn Oxide, or an In—Sn Oxide or may be formed of an oxide obtained by doping an oxide with ions of Al, Ni, Cu, Ta, Mo, Zr, V, Hf, or Ti.

The gate insulating film 113 according to some embodiments may be formed over the channel region 111c of the active layer 111. The gate insulating film 113 may be formed in the form of islands over only the channel regions 111c of the active layer 111. The gate insulating film 113 according to some embodiments may be formed over the entire front surface of the substrate 100 or the buffer layer 110 including the active layer 111.

The gate electrode 115 may be formed over the gate insulating film 113 to overlap the channel region 111c of the active layer 111. The gate electrode 115 may be formed of molybdenum Mo, aluminum Al, chromium Cr, gold Au, titanium Ti, nickel Ni, neodymium Nd, copper Cu, or an alloy thereof and may be formed as a single layer of the metal or alloy or multiple layers including two or more layers.

The interlayer insulating film 117 may be formed over the gate electrode 115 and the drain region 111d and the source region 111s of the active layer 111. In this case, the interlayer insulating film 117 may be formed over the entire front surface of the substrate 100 or the buffer layer 110 to overlay (or to cover) the gate electrode 115 and the drain region 111d and the source region 111s of the active layer 111. The interlayer insulating film 117 may be formed of an inorganic material such as a silicon oxide SiOx or a silicon nitride SiNx or may be formed of an organic material such as benzocyclobutene or photo acryl.

The drain electrode 119d may be electrically connected with the drain area 111d of the active layer 111 through a drain contact hole CHd which is formed in the interlayer insulating film 117 overlapping the drain region 111d of the active layer 111.

The source electrode 119s may be electrically connected with the source area 111s of the active layer 111 through a source contact hole CHs which is formed in the interlayer insulating film 117 overlapping the source region 111s of the active layer 111.

Each of the drain electrode 119d and the source electrode 111s may be made of the same metal material, for example, molybdenum Mo, aluminum Al, chromium Cr, gold Au, titanium Ti, nickel Ni, neodymium Nd, copper Cu, or an alloy thereof and may be formed as a single layer of the metal or alloy or multiple layers including two or more layers.

In addition, the circuit area CA further includes a switching thin-film transistor and a capacitor.

The switching thin-film transistor may be provided in the circuit area CA to have substantially the same structure as the driving thin-film transistor and thus description thereof will not be repeated. For example, the switching thin-film transistor may include a gate electrode extended or protruded from the gate line GL, a drain electrode connected to the data line DL, and a source electrode connected to the gate electrode of the driving thin-film transistor DT.

The capacitor may be provided in an overlap area of the gate electrode 115 and the source electrode 119s of the driving thin-film transistor DT with the interlayer insulating film 117 interposed therebetween.

In addition, a transistor which is provided in the circuit area CA may have characteristics that a threshold voltage thereof is shifted by light. In order to prevent this phenomenon, the light emitting display apparatus according to the present disclosure further includes a light blocking layer 101 that is provided below the active layer 111.

The light blocking layer 101 may be provided between the substrate 100 and the active layer 111 and serves to minimize or prevent change in a threshold voltage of the transistor due to external light by blocking light which is incident at the active layer 111 via the substrate 100. The light blocking layer 101 may be overlaid with the buffer layer 110. Selectively, the light blocking layer 101 may be electrically connected to the source electrode of the transistor to serve as a lower gate electrode of the corresponding transistor. In this case, the light blocking layer 101 minimizes or prevents change in characteristics due to light or change in a threshold voltage of the transistor due to a bias voltage.

The protection layer 130 may be provided over the substrate 100 to overlay (or to cover) the transistor layer. In this case, the protection layer 130 covers the drain electrode 119d and the source electrode 119s of the driving thin-film transistor DT and the interlayer insulating film 117. For example, the protection layer 130 may be formed of an inorganic material such as silicon oxide SiOx or silicon nitride SiNx. Selectively, the protection layer 130 may be referred to as a passivation layer. The protection layer 130 may be omitted.

The overcoating layer 160 may be provided over the substrate 100 to overlay (or to cover) the protection layer 130. The overcoating layer 160 may be formed in a relatively large thickness and serves to provide a flat surface over the substrate 100. For example, the overcoating layer 160 may be formed of an organic material such as photo acryl, benzocyclobutene, polyimide, or a fluorine resin.

The opening area OA may be defined as an area other than the circuit area CA in the pixel area PA from which light is emitted.

The uneven portion 170 may be provided in the opening area OA to have an undulated (or uneven) shape and thus changes a propagation path of light emitted from the light emitting element ED to increase light extraction efficiency of a pixel. To this end, the uneven portion 170 may have roughness average Ra value of about 0.19 to about 0.29 and roughness skewness Rsk value of about −0.2 to about 0.43. Here, the uneven portion 170 may be referred to as a fine structure, an optical path control portion, a microlens portion, a microlens array or a non-planar portion.

The uneven portion according to one example may include a plurality of concave portions 171 that are separated from each other and a plurality of protruding portion 173 that are provided between the plurality of concave portions 171.

Each of the plurality of concave portions 171 may be provided to be concave from the front surface 160a of the overcoating layer 160 in the opening area OA. The concave portions 171 may be separated from each other, arranged in parallel with along a first direction X, and arranged in a zigzag structure along a second direction Y intersecting the first direction X. For example, the plurality of concave portions 171 may be arranged in a line along the first direction X and staggered along the second direction Y. In this case, the plurality of concave portions 171 may be arranged in a lattice pattern with constant intervals and the concave portions 171 neighboring to each other in the second direction Y are arranged to cross each other. Accordingly, the centers of three neighboring concave portions 171 form a triangular shape TAS. Each of the plurality of concave portions 171 may be surrounded with six concave portions 171 which are disposed in the surrounding thereof. Here, the centers of the six concave portions 171 surrounding one concave portion 171 two-dimensionally form a hexagonal shape HAS (or a honeycomb structure).

In some embodiments, the plurality of concave portions 171 have the same depth from the front surface 160a of the overcoating layer 160, and some of the plurality of concave portions 171 may have different depths due to a fabrication error in a process of patterning the uneven portion 170.

The protruding portions (or convex portions) 173 may be provided between the neighboring concave portions 171 and surround the plurality of concave portions 171. The protruding portion 173 according to some embodiments may be formed in a two-dimensionally hexagonal shape and surround the plurality of concave portions 171. Accordingly, the protruding portion 173 may be formed two-dimensionally in a honeycomb structure. The protruding portion 173 may be provided at the overcoating layer 160 in the opening area OA to have a shape which can maximize external extraction efficiency of light which is emitted from the pixel on the basis of an effective emission area of the light emitting element ED. The plurality of protruding portion 173 may change a propagation path of light emitted from the light emitting element ED toward the substrate 100 to enhance the external extraction efficiency of light emitted from the light emitting element ED.

The protruding portion 173 according to one example may include multi-connection portions MCP that are provided between three neighboring concave portions (or three adjacent concave portions) 171, and a single connection portion SCP that is connected between two neighboring multi-connection portions MCP between two neighboring concave portions (or two adjacent concave portions) 171 and that have a height lower (or less) than that of the multi-connection portion MCP.

The multi-connection portions MCP may be provided between every three neighboring concave portions 171. The multi-connection portions MCP may have a sharp protruding portion in an area between (or among) three neighboring concave portions 171. For example, the multi-connection portion MCP according to one example may three-dimensionally have a triangular pyramid with concave side surfaces.

Since the one multi-connection portions MCP may be provided every three neighboring concave portions 171, the uneven portion 170 includes the plurality of multi-connection portions MCP. The plurality of multi-connection portions MCP may be arranged in the uneven portion 170 to have a hexagonal shape or a honeycomb structure. In this case, six neighboring multi-connection portions MCP forming a hexagonal shape may be arranged around one concave portion 171 at the same intervals. Accordingly, the six multi-connection portions MCP arranged around one concave portion 171 may be considered to be arranged at vertices of a hexagonal shape centered over the center of the concave portion 171. The multi-connection portions MCP may be defined as areas having the largest height in the area of a protruding portion 173 with respect to the bottom surface BS of the concave portions 171 (or the protruding portion 173).

The single connection portion SCP may be provided between two neighboring concave portions 171 and both ends thereof may be connected to two neighboring multi-connection portions MCP. The single connection portion SCP according to one example may be stepped from the multi-connection portions MCP. That is, the single connection portion SCP may be formed to have a height lower (or less) than that of the multi-connection portions MCP with respect to the bottom surface BS of the concave portion 171 (or protruding portion 173).

Six multi-connection portions MCP and six single connection portions SCP which are arranged around one concave portion 171 may be connected to each other to form a hexagonal shape. Accordingly, when six multi-connection portions MCP and six single connection portions SCP which are connected to surround one concave portion 171 may be defined as one protruding pattern (or convex patterns) having the hexagonal shape, the multi-connection portions MCP may be defined as a portion in which three protruding patterns surrounding three neighboring concave portions 171 which are arranged to form a triangular shape meet each other. Accordingly, the multi-connection portions MCP may be referred to as a multi-point or a triple point.

The single connection portions SCP according to some embodiments may have a sectional shape including a sharp peak portion PP. For example, the single connection portions SCP may include a first curved portion 173a which is provided to be concave between the bottom surface BS of the protruding portions 173 and the peak portion PP and may have a triangular section with the first curved portion 173a as a hypotenuse (or an oblique side). In this case, the total height of the peak portion PP may be lower (or less) than the total height of the multi-connection portions MCP. The peak portion PP may have a sharp tip and thus may be referred to as a first apex portion.

An interval (or a pitch) between the peak portions PP of the single connection portion SCP according to some embodiments may be equal to or less than the diameter of the bottom surface BS of the protruding portion 173. In this case, when the interval between the peak portions PP of the single connection portion SCP is greater than the diameter of the bottom surface BS of the protruding portion 173, the density of the concave portions 171 (or the protruding portions 173) which are provided in the opening area OA of the pixel area PA decreases and thus external extraction efficiency of light emitted from the light emitting element ED can decrease because the peak portion PP of the single connection portion SCP has an unsharp curved (or protruding) shape.

The uneven portion 170 according to some embodiments may be formed by forming a mask pattern over the opening area OA of the overcoating layer 160 through a photolithography using photoresist and then etching process the overcoating layer 160 using the mask pattern.

The light emitting element ED may be provided over the uneven portion 170 of the opening area OA and emits light to the substrate 100 in accordance with a bottom emission system. The light emitting element ED according to some embodiments may include a first electrode E1, a light emitting layer EL, and a second electrode E2.

The first electrode E1 may be formed over the overcoating layer 160 in the pixel area PA and is electrically connected to the source electrode 119s of the driving thin-film transistor DT. In this case, one end of the first electrode E1 adjacent to the circuit area CA extends over the source electrode 119s of the driving thin-film transistor DT and is electrically connected to the source electrode 119s of the driving thin-film transistor DT via an electrode contact hole CHe provided in the overcoating layer 160 and the protection layer 130.

The first electrode E1 comes into direct contact with the uneven portion 170 and thus has a shape (or a surface shape) which conforms to the shape of the uneven portion 170. In this case, since the first electrode E1 is formed (or deposited) in a relatively small thickness over the overcoating layer 160, the first electrode E1 has a contour (or a second contour) which conforms to the contour (morphology) (or a first contour) of the uneven portion 170. Accordingly, since the first electrode E1 may be formed in a conformal shape which conforms to the contour (or morphology) of the uneven portion 170 through a process of depositing a transparent conductive material, the first electrode E1 has the same sectional structure as the uneven portion 170.

The first electrode E1 serves as an anode electrode of the light emitting element ED. The first electrode E1 according to some embodiments may include a transparent conductive material such as transparent conductive oxide (TCO) such that light emitted from the light emitting layer EL is transmitted to the substrate 100. For example, the first electrode E1 may be formed of indium tin oxide (ITO) or indium zinc oxide (IZO).

The light emitting layer EL may be formed over the first electrode E1 and comes into direct contact with the first electrode E1. In this case, the light emitting layer EL may be formed (or deposited) in a larger thickness than the first electrode E1 and thus has a contour (a third contour) which may not fully conform to the contours of the plurality of concave portions 171 or the contours of the first electrode E1. For example, the light emitting layer EL may have a shape which conforms to the contour of the first curved portions 173a of the protruding portions 173 or the first electrode E1, and the peak portion of the light emitting layer EL overlapping the multi-connection portion MCP and the peak portion PP of each protruding portions 173 may have an unsharp convex-curved shape. Accordingly, the light emitting layer EL may be formed in a non-conformal shape which does not fully conform the contour (or morphology) of the first electrode E1 through a deposition process and thus has a sectional structure which is different from that of the first electrode E1 (or the uneven portion). The peak portion of the light emitting layer EL having a convex curved shape increases external extraction efficiency of light which is emitted from the light emitting layer EL by changing a propagation path of light which is incident thereon to extract light which is not externally extracted due to repeated total reflection in the light emitting layer EL.

The light emitting layer EL according to some embodiments may be formed to have a thickness which gradually increases toward the bottom surface BS of the protruding portions 173 or the concave portion 171. For example, the light emitting layer EL which is formed over the single connection portion SCP of the protruding portions 173 has a first thickness T1 in an upper portion of the single connection portion SCP and has a second thickness T2 which is larger than the first thickness T1 in the bottom surface BS of the concave portion 171. Similarly, the light emitting layer EL which is formed over the multi-connection portion MCP of the protruding portions 173 has a thickness which is the smallest in the multi-connection portion MCP and increases gradually from the multi-connection portion MCP to an intermediate portion of the single connection portion SCP.

The light emitting layer EL according to some embodiments may include two or more light emitting portions for emitting white light. For example, the light emitting layer EL may include a first light emitting portion and a second light emitting portion for emitting white light by mixing first light and second light. Here, the first light emitting portion emits first light and includes one of a blue light emitting portion, a green light emitting portion, a red light emitting portion, a yellow light emitting portion, and a yellowish green light emitting portion. The second light emitting portion may include a light emitting portion that emits white light by means of mixture with the first light out of one of the blue light emitting portion, the green light emitting portion, the red light emitting portion, the yellow light emitting portion, and the yellowish green light emitting portion.

The light emitting layer EL according to another embodiment may include one of a blue light emitting portion, a green light emitting portion, and a red light emitting portion. For example, when a pixel is a red pixel, a light emitting layer of the red pixel includes a red light emitting portion. When a pixel is a green pixel, a light emitting layer of the green pixel includes a green light emitting portion. When a pixel is a blue pixel, a light emitting layer of the blue pixel includes a blue light emitting portion.

The second electrode E2 may be formed over the light emitting layer EL and comes into direct contact with the light emitting layer EL. In this case, the second electrode E2 is formed (or deposited) over the light emitting layer EL to have a smaller thickness than the light emitting layer EL. Here, the second electrode E2 may be formed (or deposited) in a relatively small thickness over the light emitting layer EL and thus has a contour which conforms to the contour of the light emitting layer EL. Accordingly, the second electrode E2 may have the same sectional structure as the light emitting layer EL.

The second electrode E2 according to some embodiments may serve as a cathode electrode of the light emitting element ED. For example, the second electrode E2 may include a metal material having high reflectance to reflect light, which is emitted from the light emitting layer EL and is incident thereon, to the substrate 100. For example, the second electrode E2 may be formed in a multi-layer structure such as a stacked structure (Ti/Al/Ti) of aluminum Al and titanium Ti, a stacked structure (ITO/Al/ITO) of aluminum Al and ITO, an APC (Ag/Pd/Cu) alloy, and a stacked structure (ITO/APC/ITO) of an APC (Ag/Pd/Cu) alloy and ITO, or may have a single-layer structure including one material or two or more alloy materials selected from silver Ag, aluminum Al, molybdenum Mo, gold Au, magnesium Mg, calcium Ca, and barium Ba.

The light emitting element ED may include non-effective emission areas NEA and first and second effective emission areas EA1 and EA2 based on the thickness of the light emitting layer EL. Accordingly, the opening area OA of a pixel according to the present disclosure may include a plurality of non-effective emission areas NEA and the first and second effective emission areas EA1 and EA2.

Each non-effective emission area NEA may be provided in an area overlapping the bottom surface BS of each of the plurality of concave portions 171. For example, each non-effective emission area NEA may include an area overlapping the bottom surface BS of each of the plurality of concave portions 171 and a lower portion of the protruding portion 173 in which the light emitting layer EL is formed in a relatively large thickness. In this case, the lower portion of the protruding portion 173 may include a lower portion of the multi-connection portion MCP and a lower portion of the single connection portion SCP.

Each first effective emission area EA1 may be provided between two neighboring concave portions 171. For example, the first effective emission area EA1 may include an area overlapping a middle area and an upper area of the single connection portion SCP which is provided between two neighboring multi-connection portion MCP in which the light emitting layer EL is formed in a relatively small thickness.

Each second effective emission area EA2 may be provided between three neighboring concave portions 171. For example, each second effective emission area EA2 may include an area overlapping a middle area and an upper area of the multi-connection portion MCP which is provided between three neighboring concave portions 171 in which the light emitting layer EL is formed in a relatively more small thickness. Each second effective emission area EA2 may have higher luminance than the first effective emission areas EA1.

The opening area OA according to the present disclosure may further include a wavelength conversion layer 150.

The wavelength conversion layer 150 may be provided between the substrate 100 and the uneven portion 170 to overlap the opening area OA.

The wavelength conversion layer 150 according to some embodiments may be provided over the protection layer 130 to overlap the opening area OA. In this case, the wavelength conversion layer 150 may be supported by the protection layer 130 and may be overlaid (or covered) with the overcoating layer 160, whereby the wavelength conversion layer 150 may be provided between the protection layer 130 and the uneven portion 170 to overlap the opening area OA.

The wavelength conversion layer 150 according to another embodiment may be provided between the interlayer insulating film 117 and the protection layer 130 or between the substrate 100 and the interlayer insulating film 117 to overlap the opening area OA.

The wavelength conversion layer 150 according to a first embodiment may include a color filter that transmits only wavelengths of a color which is set for the pixel out of light emitted from the light emitting element ED to the substrate 100. For example, the wavelength conversion layer 150 may transmit only light with wavelengths of red, green, or blue. In the light emitting display apparatus according to the present disclosure, when one unit pixel includes first to third pixels adjacent to each other, the wavelength conversion layer provided in the first pixel may include a red color filter, the wavelength conversion layer provided in the second pixel may include a green color filter, and the wavelength conversion layer provided in the third pixel may include a blue color filter. In addition, in the light emitting display apparatus according to the present disclosure, one unit pixel may further include a white pixel in which a wavelength conversion layer is not formed.

The wavelength conversion layer 150 according to a second embodiment may include quantum dots having a size capable of re-emitting light according to light emitted from the light emitting element ED to the substrate 100 and discharging light of a color which is set for the pixel. In this case, the quantum dots may be selected from CdS, CdSe, CdTe, CdZnSeS, ZnS, ZnSe, GaAs, GaP, GaAs—P, Ga—Sb, InAs, InP, InSb, AlAs, AlP, and AlSb. For example, the wavelength conversion layer of the first pixel may include quantum dots of CdSe or InP, the wavelength conversion layer of the second pixel may include quantum dots of CdZnSeS, and the wavelength conversion layer of the third pixel may include quantum dots of ZnSe. In this way, the light emitting display apparatus in which the wavelength conversion layer 150 includes quantum dots can realize high color reproducibility.

The wavelength conversion layer 150 according to the third embodiment may include a color filter containing a quantum dot.

The light emitting display apparatus according to the present disclosure may further include a bank layer 190 and an encapsulation layer 200.

The bank layer 190 serves to define the opening area OA in the pixel area PA and is provided over an edge of the first electrode E1 and the overcoating layer 160. The bank layer 190 may be formed of an organic material such as a benzocyclobutene (BCB)-based resin, an acryl-based resin, or a polyimide resin. Alternatively, the bank layer 190 may be formed of a photosensitive material including a black pigment. In this case, the bank layer 190 also serves as a light blocking member between neighboring pixels.

The bank layer 190 according to some embodiments is formed over a flat surface 160a of the overcoating layer 160 to overlay (or cover) the edge of the first electrode E1 extending over the circuit area CA of the pixel area PA.

The bank layer 190 according to another embodiment may be provided to overlay (or to cover) the edge of the uneven portion 170. In this case, the light emitting layer EL is formed over the first electrode E1, the bank layer 190, and a stepped portion between the first electrode E1 and the bank layer 190. When the light emitting layer EL is formed in a small thickness over the stepped portion between the first electrode E1 and the bank layer 190, electrical contact (short-circuit) between the second electrode E2 and the first electrode E1 may occur. In order to prevent this problem, the opening area OA which is defined by the bank layer 190 is formed to have a two-dimensional size which is smaller than that of the uneven portion 170 of the overcoating layer 160. An end 190a of the bank layer 190 according to some embodiments may be disposed at an edge of the uneven portion 170 to decrease a height difference between the first electrode E1 and the bank layer 190. In this case, the end 190a of the bank layer 190 that defines a boundary between the circuit area CA (or a non-opening area) and the opening area OA of the pixel area PA may be disposed over the first electrode E1 overlapping the first curved portion 173a of the outermost protruding portion 173 out of the protruding portions 173. According to some embodiments of the present disclosure, the bank layer may overlay the edge of the uneven portion 170. For example, the end 190a of the bank layer 190 is located over the first curved portion 173a of the outermost protruding portion 173 disposed between the flat surface 160a of the overcoating layer 160 and the outermost concave portion 171.

In some embodiments, the bank layer 190 may at least partially overlay one or more of the concave portions 171 disposed at the edge of the uneven portion 170. For example, the bank layer 190 may overlay about one and half the concave portion 171. In some embodiments, the end 190a of the bank layer 190 is located between a flat surface 160a of the overcoating layer 160 and the bottom portion of the first curved portion 173a. For example, an edge of the bank layer 190 may overlap in the circuit area CA (or the non-opening area) surrounding the opening area OA. A boundary between the opening area OA and the circuit area CA (or the non-opening area) may overlap with a portion of uneven portion 170.

Additionally, the wavelength conversion layer 150 according to one embodiment may extend to overlap the bank layer 190. For example, the ends of the wavelength conversion layer 150 may be located in the circuit area CA and may underlie portions of the bank layer 190. For example, an edge of the color filter may be extended beyond an edge of the uneven portion 170 toward below the bank layer 190. And, an edge of the color filter, an edge of the uneven portion 170, and an edge of the bank layer 190 may overlap each other in the circuit area CA (or the non-opening area) surrounding the opening area OA.

The light emitting layer EL and the second electrode E2 of the light emitting element ED are also formed over the bank layer 190. In this case, the light emitting layer EL is formed over the substrate 100 in which the first electrode E1 and the bank layer 190 are provided, and the second electrode E2 is formed to overlay (or cover) the light emitting layer EL.

The encapsulation layer 200 may be formed over the substrate 100 to overlay (or to cover) the second electrode E2, that is, the entire pixel array unit 10. The encapsulation layer 200 serves to protect the thin-film transistors, the light emitting elements ED, and the like from an external impact and to prevent oxygen and/or moisture and particles from permeating the light emitting element ED.

The encapsulation layer 200 according to some embodiments may include at least one inorganic film. The encapsulation layer 200 may further include at least one organic film. For example, the encapsulation layer 200 may include a first inorganic encapsulation layer, an organic encapsulation layer, and a second inorganic encapsulation layer. The first and second inorganic encapsulation layers include one inorganic material out of a silicon oxide film SiOx, a silicon nitride film SiNx, a silicon oxynitride film SiON, a titanium oxide film TiOx, and an aluminum oxide film AlOx. The organic encapsulation layer is formed of one organic material from an acryl resin, an epoxy resin, a phenolic resin, a polyamide resin, a polyimide resin, and a benzocyclobutene resin. The organic encapsulation layer may be referred to as a particle overlay layer.

Selectively, the encapsulation layer 200 may be replaced with a filler surrounding the overall pixel array unit 10. In this case, the light emitting display apparatus according to the present disclosure further includes an encapsulation substrate 300 that is attached to the substrate 100 with the filler interposed therebetween. The encapsulation substrate 300 may be formed of a metal material.

Additionally, the light emitting display apparatus according to the present disclosure may further include a polarization film that is attached to a rear surface (or a light extraction surface) 100a of the substrate 100. The polarization film changes external light which is reflected by the thin-film transistors and/or the lines which are provided in the pixel into a circularly polarized state to improve visibility and a contrast ratio of the light emitting display apparatus. For example, the polarizing film may be embodied as a circular polarizing film.

Figure 6:
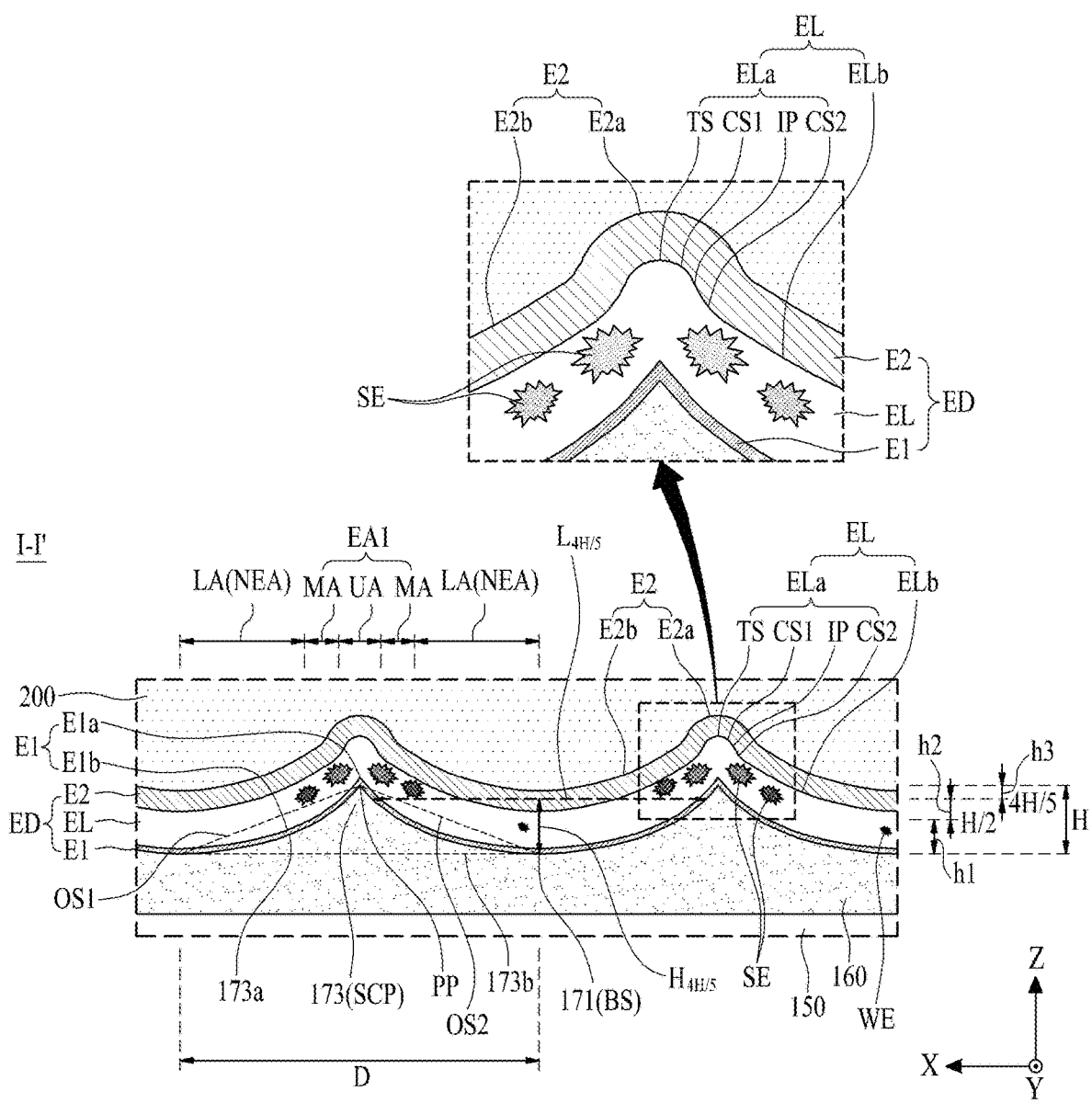
FIG. 6 is a cross-sectional view taken along line I-I' shown in FIG. 5.
Figure 7:
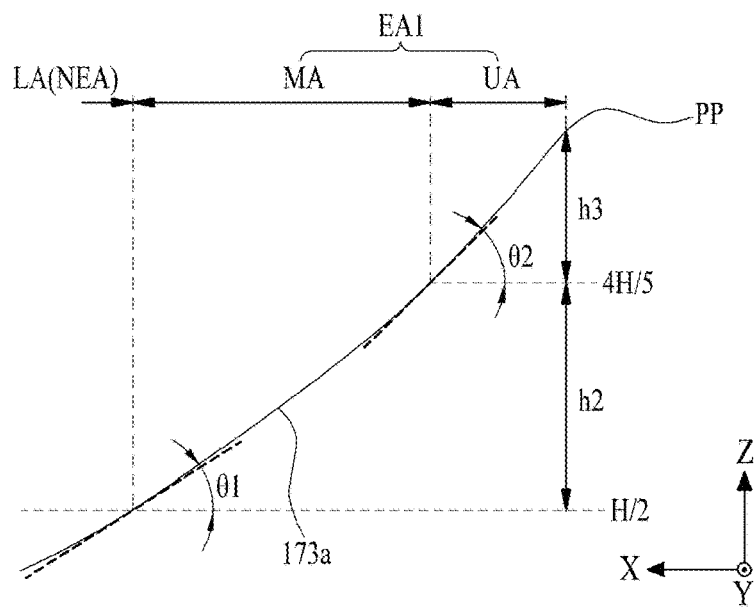
FIG. 7 is a view illustrating a first curved portion of a single connection portion in a protruding portion shown in FIG. 6.

FIG. 6 is a cross-sectional view taken along line I-I' shown in FIG. 5, and FIG. 7 is a view illustrating a first curved portion of a single connection portion in a protruding portion shown in FIG. 6. These are diagrams illustrating sectional structures of the connection portion of the protruding portion provided in the uneven portion and the light emitting element according to the present disclosure.

Referring to FIGS. 6 and 7, the single connection portion SCP of the protruding portion provided in the uneven portion 170 according to one embodiment of the present disclosure includes a sharp peak portion PP (or a first sharp portion) and thus extracts light, which is not externally extracted due to repeated total reflection in the light emitting layer EL, to the outside. In this case, external extraction efficiency of light is determined depending on the shapes of the single connection portion SCP of the protruding portion 173 and the light emitting element ED.

The single connection portion SCP of the protruding portion 173 includes a lower area LA, a middle area MA, and an upper area UA with respect to a height H thereof.

The lower area LA of the single connection portion SCP may be defined as an area corresponding to a height h1 between the bottom surface BS of the protruding portion 173 and a half-height (H/2) position with respect to the total height H between the bottom surface B S and the peak portion PP of the protruding portion 173.

The middle area MA of the single connection portion SCP may be provided between the lower area LA and the upper area UA and may be defined as an area corresponding to a height h2 between the half-height (H/2) position and a ⅘-height (4H/5) position with respect to the total height H between the bottom surface BS and the peak portion PP of the protruding portion 173.

The upper area UA of the single connection portion SCP may be provided between the middle area MA and the peak portion PP and may be defined as an area corresponding to a height h3 between the ⅘-height (4H/5) position and the peak portion PP with respect to the total height H between the bottom surface BS and the peak portion PP of the protruding portion 173.

The single connection portion SCP may include an upper side region and a lower side region with respect to the half-height (H/2) position. In this case, the lower side region of the single connection portion SCP may include the lower area LA. The upper side region of each of the plurality of protruding portions 173 may include the middle area MA and the upper area UA.

The single connection portion SCP may include a peak portion PP, a bottom surface 173b of the protruding portion 173 located in the same line as the bottom surface BS of the concave portion 171, and a first curved portion 173a which is provided to be concave between the peak portion PP and the bottom surface BS. The single connection portion SCP may have a triangular sectional structure including a vertex corresponding to the peak portion PP, a bottom side corresponding to the bottom surface 173b of the protruding portion 173, and hypotenuses OS1 and OS2 corresponding to the first curved portions 173a.

The peak portion PP of the single connection portion SCP may be formed in a sharp structure to enhance light extraction efficiency of the pixel. The first curved portions 173a of the single connection portion SCP may be formed in a concave curved shape between the peak portion PP and the bottom surface 173b of the protruding portion 173.

The first curved portions 173a of the single connection portion SCP may have a tangent slope which decreases gradually from the peak portion PP to the bottom surface BS of the concave portion 171. In this case, the tangent slope may be defined as a tangential value of an angle between an extension line extending from the bottom surface 173b of the protruding portion 173 and the first curved portions 173a.

The first curved portions 173a according to some embodiments may have a largest tangent slope, that is, a maximum tangent slope, at the upper portion of the single connection portion SCP, and may preferably have a maximum tangent slope at ⅘-height (4H/5) position which is the boundary between the middle area MA and the upper area UA of the single connection portion SCP. For example, the first curved portions 173a may have a first tangent slope tan θ1 at the half-height (H/2) position of the single connection portion SCP and a second tangent slope tan θ2 at the ⅘-height (4H/5) position of the single connection portion SCP. In this case, the second tangent slope tan θ2 is larger than the first tangent slope tan θ1 such that light emitted from the first effective emission area EA1 of the single connection portion SCP is not trapped in the light emitting element ED but is extracted to the outside as much as possible. When the second tangent slope tan θ2 is smaller than the first tangent slope tan θ1, the upper area UA of the single connection portion SCP has a slow slope and thus light emitted from the first effective emission area EA1 is not extracted to the outside due to total reflection but is trapped in the light emitting element ED, whereby the light extraction efficiency decreases.

The light emitting element ED over the single connection portion SCP according to the present disclosure may emit a maximum amount of light from an area with the maximum tangent slope in the first curved portions 173a of the single connection portion SCP. When the maximum tangent slope of the first curved portions 173a is located in the middle area MA and the upper area UA of the single connection portion SCP which are the first effective emission area EA1, light emitted from the light emitting element ED propagates at an angle less than a total reflection threshold value, and the maximum light extraction efficiency may be achieved as the external emission efficiency increases due to multiple reflection. For this end, in an example of the present disclosure, by locating the maximum tangent slope of the first curved portions 173a at the ⅘-height (4H/5) position which is the boundary between the middle area MA and the upper area UA of the single connection portion SCP, it is possible to enhance the external extraction efficiency of light emitted from the first effective emission area EA1 of the single connection portion SCP. In another example of the present disclosure, by gradually increasing the tangent slope of the first curved portions 173a from the ⅘-height (4H/5) position to the peak portion PP of the single connection portion, it is possible to maximize the external extraction efficiency of light emitted from the first effective emission area EA1 of the single connection portion SCP.

The first electrode E1 over the single connection portion SCP according to the present disclosure may be formed to be in contact with the surfaces of the single connection portion SCP and has a relatively small thickness, and thus has a contour which conforms to the contour of single connection portion SCP. For example, the first electrode E1 over the single connection portion SCP may be formed to overlay (or to cover) the single connection portion SCP in a conformal manner through a process of depositing a transparent conductive material. For example, the first electrode E1 over the single connection portion SCP may include a second sharp portion E1a having a sharp shape which is formed over the peak portion PP and a second curved portion E1b having a concave curved shaped which is formed over the first curved portions 173a of the single connection portion SCP. Here, the second curved portion E1b has a symmetric structure with respect to the second sharp portion E1a.

The light emitting layer EL of the light emitting element ED provided over the single connection portion SCP according to the present disclosure may be formed to have a thickness increasing gradually from the upper area UA to the lower area LA depending on the shape of the single connection portion SCP. For example, when the light emitting layer EL may be deposited using a deposition method, a deposition material for the light emitting layer EL has straightness in the vertical direction Z and thus the light emitting layer EL has different thicknesses in the upper area UA, the middle area MA, and the lower area LA of the single connection portion SCP depending on the tangent slope of the single connection portion SCP. In this case, the light emitting layer EL over the single connection portion SCP has the smallest thickness in the upper area UA of the single connection portion SCP in which the tangent slope is relatively large and has the largest thickness in the lower area LA of the single connection portion SCP in which the tangent slope is relatively small (or relatively slow).

When the light emitting layer EL includes an organic light emitting layer, emission of light from the light emitting element ED occurs mainly in an area having a high current density. In the light emitting element ED over the single connection portion SCP according to the present disclosure, relatively strong emission of light SE occurs due to a relatively high current density in the upper area UA and the middle area MA of the single connection portion SCP having a relatively small thickness, and relatively weak (or slight) emission of light WE occurs due to a relatively low current density in the lower area LA of the single connection portion SCP having a relatively large thickness. Accordingly, the upper area UA and the middle area MA of the single connection portion SCP are defined as a first effective emission area EA1 (or a first partial emission area) in the opening area OA, and the lower area LA of the single connection portion SCP is defined as a non-effective emission area NEA (or a non-emission area) in the opening area OA.

The light emitting layer EL over the single connection portion SCP according to the present disclosure may be formed to be non-conformal with respect to the first electrode E1 or the single connection portion SCP of the protruding portion 173. According to some embodiments, the light emitting layer EL over the single connection portion SCP may include a first uplifted portion ELa which overlaps the peak portion PP of the single connection portion SCP (or the second sharp portion of the first electrode E1) and a third curved portion ELb which overlaps the first curved portions 173a of the single connection portion SCP.

The third curved portion ELb may be formed over the second curved portion E1b of the first electrode E1 and has a symmetric structure with respect to the first uplifted portion ELa. The light emitting layer EL including the third curved portion ELb may be formed to have a thickness which increases gradually toward the concave portion 171 of the uneven portion 170. In this case, the third curved portion ELb of the light emitting layer EL may have a first thickness in the upper side region MA and UA including the peak portion PP of the single connection portion SCP and may have a second thickness larger than the first thickness in the bottom surface BS of the concave portion 171. Accordingly, the light emitting layer EL over the single connection portion SCP strongly emits light in the upper side region MA and UA of the single connection portion SCP having a high current density due to the relatively small first thickness and thus it is possible to enhance light extraction efficiency. On the other hand, the light emitting layer EL over the single connection portion SCP weakly emits light in the lower side region LA of the single connection portion SCP having a low current density due to the relatively large second thickness and thus it is possible to reduce power consumption.

The first uplifted portion ELa may be formed convex to have a non-conformal shape with respect to the peak portion PP with a sharp structure of the single connection portion SCP. In this case, the first uplifted portion ELa protrudes from the third curved portion ELb overlapping the peak portion PP of the single connection portion SCP to overlay (or to cover) the peak portion PP of the single connection portion SCP. The first uplifted portion ELa may be referred to as a convex protruding portion.

The first uplifted portion ELa may be formed to have a curvature for preventing light, which is totally reflected and incident in the light emitting layer EL due to emission of light from the light emitting layer EL, from being totally reflected into the light emitting layer EL again. For example, the first uplifted portion ELa may have a dome or bell structure having a convex sectional shape. The first uplifted portion ELa reflects light, which is totally reflected in the light emitting layer EL and incident due to emission of light from the light emitting layer EL, toward the substrate 100 to increase the external extraction efficiency of light which is emitted from the light emitting layer EL. For example, the first uplifted portion ELa serves as a concave lens that reflects light which is emitted from the first effective emission area EA1 of the light emitting element ED and is incident thereon toward the substrate 100.

The first uplifted portion ELa according to some embodiments may have a dome structure having an inflection portion IP. In this case, the first uplifted portion ELa may include a tip surface TS (or a top surface TS), an inflection portion IP, a convex surface CS1, and a concave surface CS2. The first uplifted portion ELa may have a symmetric structure with respect to the tip surface TS.

The tip surface TS may overlap the peak portion PP of the single connection portion SCP. For example, the tip surface TS overlaps the second sharp portion E1a of the first electrode E1 having a sharp shape.

The inflection portion IP may be located between the tip surface TS and the third curved portion ELb. For example, the inflection portion IP may be located over the first curved portions 173a between the peak portion PP and the 4/5-height (4H/5) position of the single connection portion SCP to reflect light, which is totally reflected from the peak portion PP of the single connection portion SCP, toward the substrate, whereby it is possible to enhance external extraction efficiency of light. The inflection portion IP is also referred to as an inflection point.

The convex surface CS1 may be formed to be convex from the tip surface TS. In this case, the convex surface CS1 may be formed to be convex between the tip surface TS and the inflection portion IP. The concave surface CS2 may be formed to be concave from the convex surface CS1. For example, the concave surface CS2 may be formed to be concave between the inflection portion IP and the third curved portion ELb. The convex surface CS1 and the concave surface CS2 change a path of light which is incident at the first uplifted portion ELa from the light emitting element ED toward the substrate to prevent total reflection of incident light, whereby it is possible to enhance light extraction efficiency of a pixel.

Since the second electrode E2 of the light emitting element ED provided over the single connection portion SCP according to the present disclosure may be formed to be in contact with the surface of the light emitting layer EL and has a thickness smaller than that of the light emitting layer EL, the second electrode E2 has a contour which conforms to the contour of the light emitting layer EL. For example, the second electrode E2 over the single connection portion SCP may include a first dome portion E2a that overlaps the first uplifted portion ELa of the light emitting layer EL and a fourth curved portion E2b that is formed over the third curved portion ELb of the light emitting layer EL. The second electrode E2 of the single connection portion SCP reflects a path of light which is incident thereon from the light emitting element ED over the single connection portion SCP toward the substrate to prevent total reflection of incident light, whereby it is possible to improve light extraction efficiency of a pixel.

Figure 8:
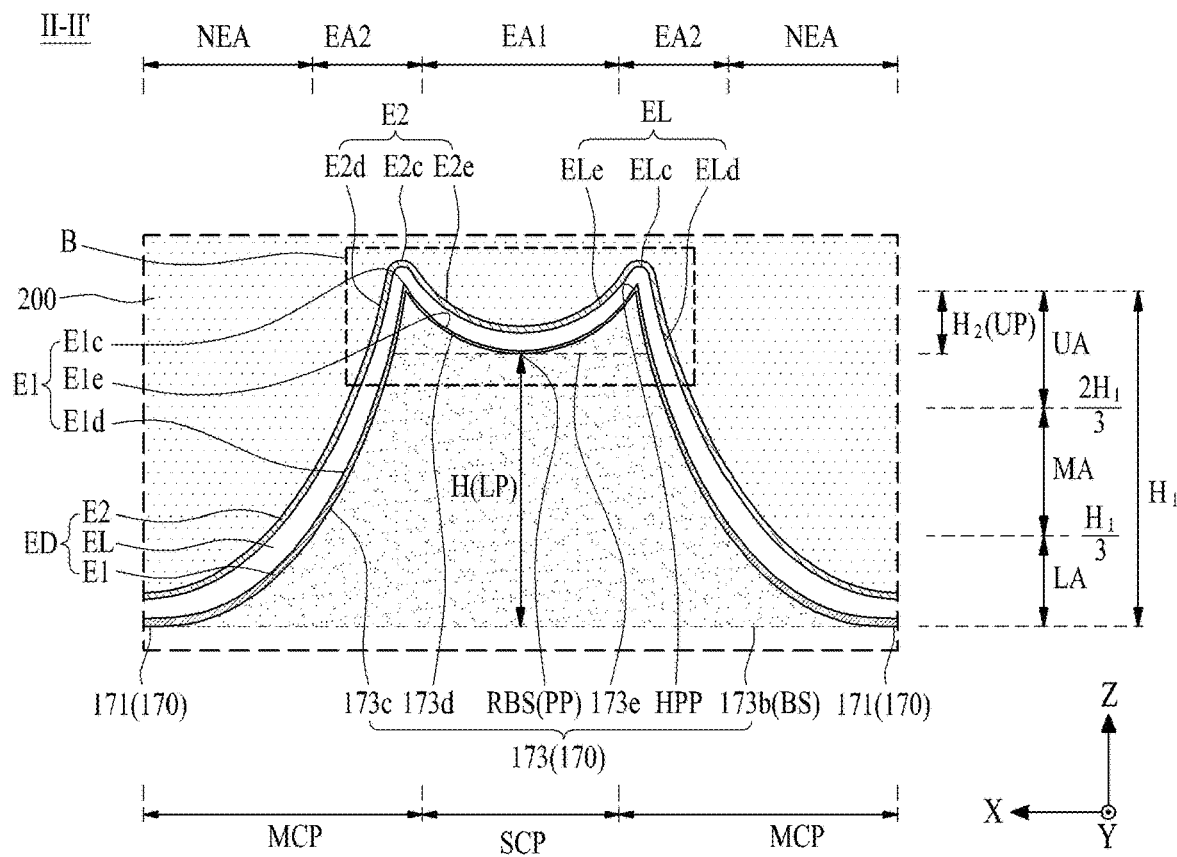
FIG. 8 is a cross-sectional view taken along line II-IF shown in FIG. 5.
Figure 9:
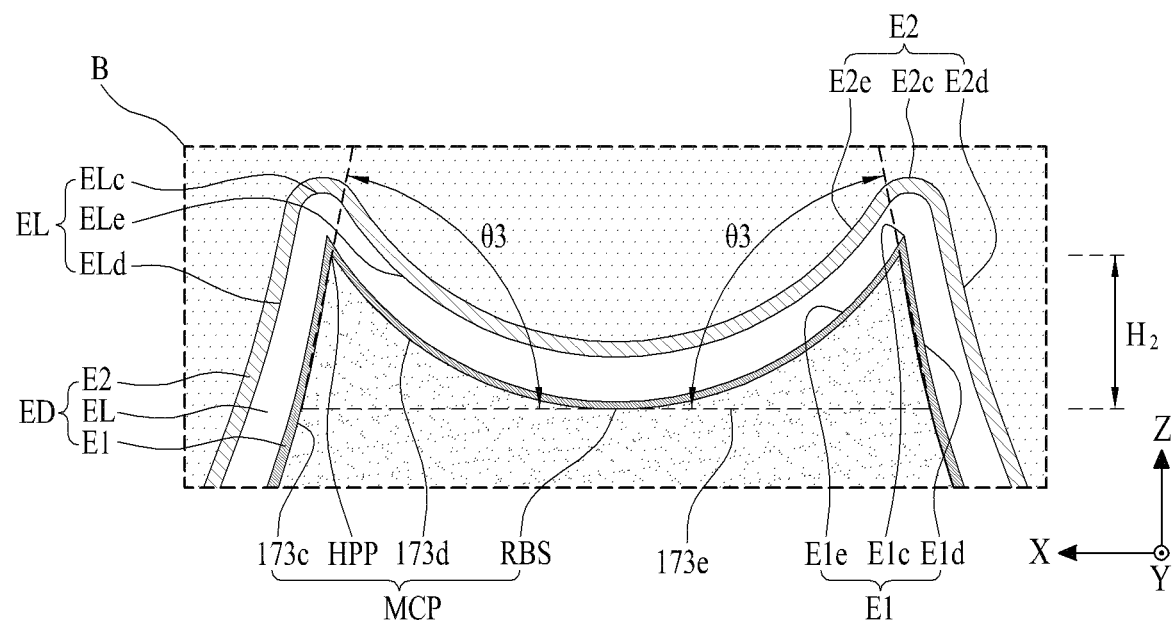
FIG. 9 is an enlarged view illustrating a portion B shown in FIG. 8.

FIG. 8 is a cross-sectional view taken along line II-IP shown in FIG. 5, and FIG. 9 is an enlarged view illustrating a portion B shown in FIG. 8. These drawings are intended to describe a sectional structure of the multi-connection portion and the single connection portion of the protruding portion provided in the uneven portion and the light emitting diode according to the present disclosure.

Referring to FIGS. 5 to 9, the multi-connection portion MCP of the protruding portion 173 provided in the uneven portion 170 according to the embodiment of the present disclosure may include a sharp structure between three neighboring concave portions 171 and thus extracts light, which is not externally extracted due to repeated total reflection in the light emitting layer EL, to the outside. In this case, the shape of the multi-connection portion MCP may be determined depending on the shape of the single connection portion SCP.

The multi-connection portion MCP according to some embodiments may include a highest peak portion HPP having a sharp structure, a first inclined surface 173c between the highest peak portion HPP and the concave portion 171, and a first ridge portion 173d between the highest peak portion HPP and the peak portion PP of the single connection portion SCP.

The highest peak portion HPP may have a sharp structure protruding sharp in the middle between three neighboring concave portions 171. In this case, the highest peak portion HPP may be formed to be higher than the peak portion PP of the single connection portion SCP. The highest peak portion HPP according to some embodiments may be formed with a first height $H_1$ from the bottom surface 173b (or BS) of the protruding portion 173, and thus the tip (or end) of the highest peak portion HPP may have a sharp shape and may be located at the highest position in the uneven portion 170.

The first inclined surface (or first slope surface) 173c may be formed to be concave between the highest peak portion HPP and the concave portion 171. In this case, the first inclined surface 173c may be formed in a concave curved shape between the highest peak portion HPP and the bottom surface BS of the concave portion 171. The first inclined surface 173c may have a tangent slope which increases gradually from the bottom surface BS of the concave portion 171 to the highest peak portion HPP, and thus the tip (or end) of the highest peak portion HPP may have a sharp structure.

The first ridge portion 173d may be formed to be concave between the highest peak portion HPP and the peak portion PP of the single connection portion SCP. In this case, the first ridge portion 173d may be formed in a concave curved shape between two neighboring multi-connection portions MCP with the single connection portion SCP interposed therebetween. Accordingly, the protruding portion 170 further includes the first ridge portion 173d which is provided to be concave between two neighboring multi-connection portions MCP. For example, the first ridge portion 173d may have a concave sectional structure and thus may be referred to as a recessed portion.

The first ridge portion 173d according to some embodiments includes a ridge bottom surface RBS corresponding to the middle of the single connection portion SCP which is provided between two neighboring multi-connection portions MCP. The ridge bottom surface RBS may be an end of the peak portion PP of the single connection portion SCP that is provided in the middle between two neighboring multi-connection portions MCP. For example, the ridge bottom surface RBS may correspond to an end of the peak portion PP which is located at the smallest height from the bottom surface 173b of the protruding portion 173 in the peak portion PP of the single connection portion SCP provided between two neighboring multi-connection portions MCP. In this case, the height between the bottom surface 173b of the protruding portion 173 and the ridge bottom surface RBS is the same as the total height H between the peak portion PP of the connection portion provided in the middle between two neighboring multi-connection portions MCP and the bottom surface 173b of the protruding portion 173.

The multi-connection portion MCP according to some embodiments may include a lower side portion LP and an upper side portion UP which are defined with respect to the ridge bottom surface RBS.

The lower side portion LP may be defined as an area located below an extension line extending from the ridge bottom surface RBS in the multi-connection portion MCP with respect to the height of the multi-connection portion MCP. In this case, the lower side portion LP may be defined as an area between the bottom surface 173b of the protruding portion 173 and the ridge bottom surface RBS.

The upper side portion UP may be defined as an area located above the external line extending from the ridge bottom surface RBS in the multi-connection portion MCP with respect to the height of the multi-connection portion MCP. In this case, the upper side portion UP of the multi-connection portion MCP may be defined as an area between the ridge bottom surface RBS and the highest peak portion HPP and may have a second height $H_2$. The upper side portion UP of the multi-connection portion MCP may be connected to three neighboring connection portions CP and thus three-dimensionally has a triangular pyramid having concave side surfaces.

The multi-connection portion MCP according to some embodiments may include a lower area LA, a middle area MA, and an upper area UA which are defined with respect to the first height $H_1$ between the bottom surface 173b of the protruding portion 173 and the highest peak portion HPP. The lower area LA of the multi-connection portion MCP may be defined as an area between the bottom surface 173b of the protruding portion 173 and a ⅓-height ($H_1/3$) position of the first height $H_1$. The middle area MA of the multi-connection portion MCP may be defined as an area between the ⅓-height ($H_1/3$) position and a ⅔-height ($2H_1/3$) position with respect to the first height $H_1$. The upper area UA of the multi-connection portion MCP may be defined as an area between the ⅔-height ($2H_1/3$) position with respect to the first height $H_1$ and the highest peak portion HPP.

An angle θ3 between an extension line 173e extending from the ridge bottom surface RBS and the highest peak portion HPP of the multi-connection portion MCP affects an emission spectrum at the multi-connection portion MCP and external extraction efficiency of light. According to some embodiments, the angle θ3 between the highest peak portion HPP and the ridge bottom surface RBS of the first inclined surface 173c may be set to be equal to or greater than about 15 degrees and less than about 75 degrees. In this case, an emission spectrum in which a micro cavity at the first inclined surface 173c and a microcavity at the first ridge portion 173d match each other is generated and thus it is possible to improve emission efficiency and to improve external extraction efficiency of light.

When the angle θ3 between the ridge bottom surface RBS and the highest peak portion HPP of the multi-connection portion MCP is less than about 15 degrees, the first inclined surface 173c provided in the upper side portion UP of the multi-connection portion MCP has a small slope, and thus the highest peak portion HPP of the multi-connection portion MCP has an unsharp convex-curved shape. Accordingly, light emitted from the light emitting element ED over the multi-connection portion MCP is not externally extracted but is trapped in the light emitting element ED, whereby light extraction efficiency may decrease. When the angle θ3 between the ridge bottom surface RBS and the highest peak portion HPP of the multi-connection portion MCP is greater than about 75 degrees, the first inclined surface 173c provided in the upper side portion UP of the multi-connection portion MCP has a large slope, and thus asymmetry between the slope of the first inclined surface 173c and the slope of the first ridge portion 173d increases much. Accordingly, an emission spectrum in which a microcavity at the first inclined surface 173c and a microcavity at the first ridge portion 173d do not match each other is generated and thus emission efficiency may decrease.

Since the first electrode E1 of the light emitting element ED which is provided over the multi-connection portion MCP of the protruding portion 173 is in contact with the surface of the multi-connection portion MCP and has a relatively small thickness, the first electrode E1 has a contour which conforms to the contour of the multi-connection portion MCP. For example, the first electrode E1 over the multi-connection portion MCP may be formed to overlay (or to cover) the multi-connection portion MCP in a conformal manner through a process of depositing a transparent conductive material. According to some embodiments, the first electrode E1 over the multi-connection portion MCP may include a third sharp portion E1c having a sharp shape that is formed over the highest peak portion HPP of the multi-connection portion MCP, a second inclined surface E1d having a concave curved shape that is formed over the first inclined surface 173c of the multi-connection portion MCP, and a second ridge portion E1e having a concave curved shape that is formed over the first ridge portion 173d of the multi-connection portion MCP. In this case, the second inclined surface E1d may be formed to be conformal to the first inclined surface 173c of the multi-connection portion MCP, and the second ridge portion E1e may be also formed to be conformal to the first ridge portion 173d of the multi-connection portion MCP.

The light emitting layer EL of the light emitting element ED provided over the multi-connection portion MCP according to the present disclosure may have a thickness which increases gradually from the upper area UA to the lower area LA depending on the shape of the multi-connection portion MCP. In this case, similarly to the light emitting layer EL over the single connection portion SCP, the light emitting layer EL over the multi-connection portion MCP may have the smallest thickness in the upper side portion UP having a relatively large tangent slope and has the largest thickness in the lower area LA having a relatively small tangent slope (or a relatively slow slope).

The light emitting layer EL over the multi-connection portion MCP according to the present disclosure may be formed to be non-conformal to the first electrode E1 over the multi-connection portion MCP. According to some embodiments, the light emitting layer EL over the multi-connection portion MCP may include a second uplifted portion ELc that overlaps the highest peak portion HPP of the multi-connection portion MCP (or the third sharp portion E1c of the first electrode E1), a third inclined surface ELd that overlaps the first inclined surface 173c of the multi-connection portion MCP (or the second inclined surface E1d of the first electrode E), and a third ridge portion ELe that overlaps the first ridge portion 173d of the multi-connection portion MCP (or the second ridge portion E1e of the first electrode E1).

The second uplifted portion ELc may be formed to be convex in a non-conformal shape which is non-conformal to the highest peak portion HPP having a sharp structure of the multi-connection portion MCP. In this case, the second uplifted portion ELc may protrude convexly from the third inclined surface ELd and the third ridge portion ELe to overlap the highest peak portion HPP of the multi-connection portion MCP and may overlay (or cover) the highest peak portion HPP of the multi-connection portion MCP. The second uplifted portion ELc may be referred to as a convex protrusion.

The second uplifted portion ELc may be formed to have a curvature for preventing light, which is totally reflected in the light emitting layer EL by emission of light from the light emitting layer EL and is incident thereon, from being totally reflected again in the light emitting layer EL. The second uplifted portion ELc according to some embodiments may include a dome or bell structure having a convex sectional shape. The second uplifted portion ELc reflects light, which is totally reflected in the light emitting layer EL by emission of light from the light emitting layer EL and is incident thereon, toward the substrate and enhance external extraction efficiency of light emitted from the light emitting layer EL. For example, the second uplifted portion ELc serves as a concave lens that reflects light, which is emitted in the second effective emission area EA2 of the light emitting element ED provided between three neighboring concave portions 171 and is incident thereon, toward the substrate.

The third inclined surface ELd may be formed over the second inclined surface E1d of the first electrode E1. The light emitting layer EL including the third inclined surface ELd may be formed to have a thickness that increases gradually from the highest peak portion HPP of the multi-connection portion MCP to the bottom surface BS of the concave portion 171 depending on the slope of the first inclined surface 173c of the multi-connection portion MCP. In this case, the third inclined surface ELd of the light emitting layer EL has a first thickness over the upper side portion UP of the multi-connection portion MCP and a second thickness greater than the first thickness over the bottom surface BS of the concave portion 171. Accordingly, the light emitting layer EL over the multi-connection portion MCP strongly emits light over the upper side portion UP with a high current density due to the first thickness which is relatively small and thus has high light extraction efficiency. On the other hand, the light emitting layer EL over the multi-connection portion MCP weakly emits light over the lower side portion LA of the multi-connection portion MCP and the bottom surface BS of the concave portion 171 having a low current density due to the second thickness which is relatively large and thus reduces power consumption.

The third ridge portion ELe may be formed over the second ridge portion E1e of the first electrode E1. In this case, the light emitting layer EL including the third ridge portion ELe may be formed to have a thickness which increases gradually from the highest peak portion HPP of the multi-connection portion MCP to the ridge bottom surface RBS depending on the slope of the first ridge portion 173d of the multi-connection portion MCP.

When the light emitting layer includes an organic light emitting layer, emission of light from the light emitting element ED occurs mainly in an area with a high current density. In the light emitting element ED over the multi-connection portion MCP according to the present disclosure, relatively strong emission of light occurs due to a relatively high current density in the upper area UA and the middle area MA of the multi-connection portion MCP with a relatively small thickness, and relatively weak (or insignificant) emission of light occurs due to a relatively low current density in the lower area LA of the multi-connection portion MCP with a relatively large thickness. Accordingly, the upper area UA and the middle area MA of the multi-connection portion MCP may be defined a second effective emission area EA2 (or a second partial emission area) in the opening area OA, and the lower area LA of the multi-connection portion MCP may be defined as a non-effective emission area NEA (or a non-emission area) in the opening area OA. Here, since the highest peak portion HPP of the multi-connection portion MCP has a shape higher and sharper than that of the peak portion PP of the single connection portion SCP, the light emitting layer EL which is formed over the upper side portion UP of the multi-connection portion MCP has a thickness smaller than that of the light emitting layer EL which is formed over the peak portion PP of the single connection portion SCP. Accordingly, since stronger emission of light occurs in the second effective emission area EA2 over the multi-connection portion MCP than in the first effective emission area EA1 over the single connection portion SCP, the second effective emission area EA2 has higher luminance than the first effective emission area EA1.

The second electrode E2 of the light emitting element ED which is provided over the multi-connection portion MCP according to the present disclosure is in contact with the surface of the light emitting layer EL over the multi-connection portion MCP and has a thickness smaller than that of the light emitting layer EL, and thus has a contour which conforms to the contour of the light emitting layer EL over the multi-connection portion MCP. For example, the second electrode E2 over the multi-connection portion MCP includes a second dome portion E2c which is convex to overlap the second uplifted portion ELc of the light emitting layer EL, a fourth inclined surface E2d that is formed over the third inclined surface ELd of the light emitting layer EL, and a fourth ridge portion E2e that is formed over the third ridge portion ELe of the light emitting layer EL. The second electrode E2 over the multi-connection portion MCP reflects light which is incident from the light emitting element ED over the multi-connection portion MCP toward the substrate, whereby it is possible to prevent total reflection of the incident light and thus to improve light extraction efficiency of the pixel.

In the light emitting display apparatus according to one embodiment of the present disclosure, the path of the light emitted from the light emitting diode ED may be changed by the uneven portion 170, which includes concave portions 171 and the protruding portion 173 provided in the opening area OA of the pixel, to improve light extraction efficiency, whereby luminance may be improved and power consumption may be reduced. Also, in the light emitting display apparatus according to one embodiment of the present disclosure, since the light emitting layer EL has a surface shape different from that of the uneven portion 170 provided in the opening area OA of the pixel, the light which is not extracted to the outside by total reflection repeated in the light emitting layer EL may be reflected by the peak portion of the light emitting diode ED having an unsharp convex-curved shape over the peak portion PP and the multi-connection portion MCP of the protruding portion 173 and then extracted to the outside, whereby external extraction efficiency of the light may be more improved. That is, in the light emitting display apparatus according to one embodiment of the present disclosure, external extraction efficiency of the light may be more improved due to addition light extraction in the multi-connection portion MCP among three neighboring concave portions 171 provided in the uneven portion 170 as well as light extraction in the single connection portion SCP provided between two neighboring concave portions 171 provided in the uneven portion 170.

In the light emitting display apparatus according to one embodiment of the present disclosure, the uneven portion 170 provided in the opening area OA of the pixel includes the concave portions 171 and the protruding portion 173 and therefore has surface roughness according to the height of the concave portions 171 and the protruding portion 173. The surface roughness of the uneven portion 170 affects light extraction efficiency by changing the path of the light emitted from the light emitting diode ED. Therefore, the surface roughness of the uneven portion 170 may be a variable that determines light emission efficiency, light extraction efficiency and current efficiency enhancement of the light emitting display apparatus. An example of the variable, which determines surface roughness of the uneven portion 170, may include roughness average Ra or roughness skewness Rsk.

The roughness average Ra is an average value of the surface roughness in a reference length of a unit size US (or unit area), and is represented by an average value of absolute values Z(x) of a reference length 1 from the center line of the concave portions 171 and the protruding portion 173 to a section curve of the surface as expressed by the following Equation 1. In this case, the center line of the concave portions 171 and the protruding portion 173 is a graphical center line, and may mean a straight line where areas surrounded by a virtual line and a sectional curve are equal to each other when the virtual line parallel with the sectional curve is drawn in the reference length 1, or may mean a straight line where an integral value becomes about 0 (zero) when the straight line is drawn in the sectional curve in the reference length 1. The roughness average Ra is an average value for a height of the concave portions 171 and the protruding portion 173 provided in the uneven portion 170, and may represent an average value of coordinates in a height direction.

$$Ra = \frac{1}{l}\int_0^l |Z(x)|dx \qquad \text{Equation 1}$$

Since the roughness average Ra of the uneven portion 170 represents a thickness (or height) of the protruding portion 173 arranged in the uneven portion 170, the roughness average Ra of the uneven portion 170 may represent light extraction efficiency in the unit size US including light extraction efficiency for the multi-connection portion MCP as well as light extraction efficiency for the single connection portion SCP of the protruding portion 173 arranged in the unit size US.

The roughness skewness Rsk is a value indicating a skewness direction and level for frequency distribution in the reference length of the unit size US, and may be represented by a sum of a length of a sectional curve, which is selected in a height within a random sectional curve range parallel with the center line in the reference length/and projected in the center line, as expressed by the following Equation 2. The roughness skewness Rsk may represent a characteristic average value of a height direction, which expresses a symmetrical level of hill and valley by using an average line as a center line.

$$Rsk = \frac{1}{Rq^3}\left[\frac{1}{l}\int_0^l Z^3(x)dx\right] \qquad \text{Equation 2}$$

$$※ \quad Rq = \sqrt{\frac{1}{l}\int_0^l Z^2(x)dx}$$

In the Equation 2, root-mean-square roughness Rq indicates a root mean square of Z(x) in the reference length 1.

When the roughness skewness Rsk has a value of about 0 (zero), it may be construed that hill and valley are distributed symmetrically based on the average line. When the roughness skewness Rsk has a value smaller than about 0 (zero), it may be construed that hill and valley are distributed to be inclined downwardly based on the average line. When the roughness skewness Rsk has a value greater than about 0 (zero), it may be construed that hill and valley are distributed to be inclined upwardly based on the average line. The roughness skewness Rsk denotes a slope level of the concave portions 171 and the protruding portion 173 provided in the uneven portion 170, and may represent a width level of the concave portion 171 or a pointed level of the protruding portion 173.

Since the roughness skewness Rsk value of the uneven portion 170 represents a width or a pointed level of the protruding portion 173 arranged in the uneven portion 170, the roughness skewness Rsk may represent light extraction efficiency in the unit size US including light extraction efficiency for the multi-connection portion MCP as well as light extraction efficiency for the single connection portion SCP of the protruding portion 173 arranged in the unit size US.

The uneven portion 170 provided in the opening area OA of the pixel according to the present disclosure may have at least one of roughness average Ra value of about 0.19 to about 0.29 and roughness skewness Rsk value of about −0.2 to about 0.43 within the unit size.

The unit size US (or unit measurement area), as shown in FIG. 5, may have a rectangular shape having a second length along a second direction Y while having a first length along a first direction X in plan view.

A first length (or horizontal length) of the unit size US may be set to a length between peak portions PP of two single connection portions SCP parallel with each other by interposing one concave portion 171. For example, the first length of the unit size US may be set to the same length as a pitch of the protruding portion 173, that is, an interval between the peak portions PP of the single connection portion SCP.

A second length (or vertical length) of the unit size US may be set to a sum of a length between the highest peak portions HPP of two multi-connection portions MCP parallel with each other by interposing one concave portion 171 and a length between the highest peak portions HPP of two multi-connection portions MCP by interposing the single connection portion SCP. For example, the second length of the unit size US may be set to a sum of the pitch of the protruding portion 173 and a length of the first ridge portion 173d of the multi-connection portion MCP.

When the roughness average Ra value of the uneven portion 170 has a range of about 0.19 to about 0.29, light extraction efficiency is more increased than the case that the roughness average Ra value is less than about 0.19 or exceeds about 0.29.

For example, when the roughness average Ra value of the uneven portion 170 is less than about 0.19, a height H of the protruding portion 173 becomes too low or flat due to relatively low surface roughness, whereby a waveguide is formed. For this reason, the light emitted from the light emitting diode ED is repeatedly subjected to total reflection without progressing to the substrate, and therefore is confined in the light emitting diode ED, whereby light extraction efficiency may be deteriorated.

When the roughness average Ra value of the uneven portion 170 exceeds about 0.29, the height H of the protruding portion 173 becomes too high due to relatively high surface roughness, whereby a tangent slope in the upper area UA of the protruding portion 173 is increased. For this reason, the amount of light confined in the light emitting diode ED may be increased, whereby light extraction efficiency may be deteriorated. Also, if the height H of the protruding portion 173 becomes too high, the concave portion 171 may serve as a lens to allow light diffused by the protruding portion 173 to be confined in the concave portion 171 without progressing to the substrate, whereby light extraction efficiency may be deteriorated.

When the roughness skewness Rsk value of the uneven portion 170 has a range of about −0.2 to about 0.43, light extraction efficiency is more increased than the case that the roughness skewness Rsk value is less than about −0.2 or exceeds about 0.43.

For example, when the roughness skewness Rsk value of the uneven portion 170 is less than about −0.2, a width of the protruding portion 173 becomes too wide, whereby the peak portion PP and/or the highest peak portion HPP of the protruding portion 173 are/is formed in an unsharp convex-curved shape. For this reason, the light emitted from the light emitting diode ED is confined in the light emitting diode ED without being extracted to the outside due to total reflection, whereby light extraction efficiency may be deteriorated. Also, when the peak portion PP and/or the highest peak portion HPP of the protruding portion 173 are/is formed in an unsharp convex-curved shape, the light emitting layer EL formed over the protruding portion 173 may be relatively thick and therefore causes relatively low current density, whereby relatively weak light emission is generated to deteriorate light emitting efficiency. As a result, light extraction efficiency at the peak portion PP and/or the highest peak portion HPP of the protruding portion 173 may be deteriorated.

When the roughness skewness Rsk value of the uneven portion 170 exceeds about 0.43, the width of the protruding portion 173 becomes too narrow or flat, whereby a waveguide is formed. For this reason, the light emitted from the light emitting diode ED is repeatedly subjected to total reflection without progressing to the substrate, and therefore is confined in the light emitting diode ED, whereby light extraction efficiency may be deteriorated.

Figure 10:
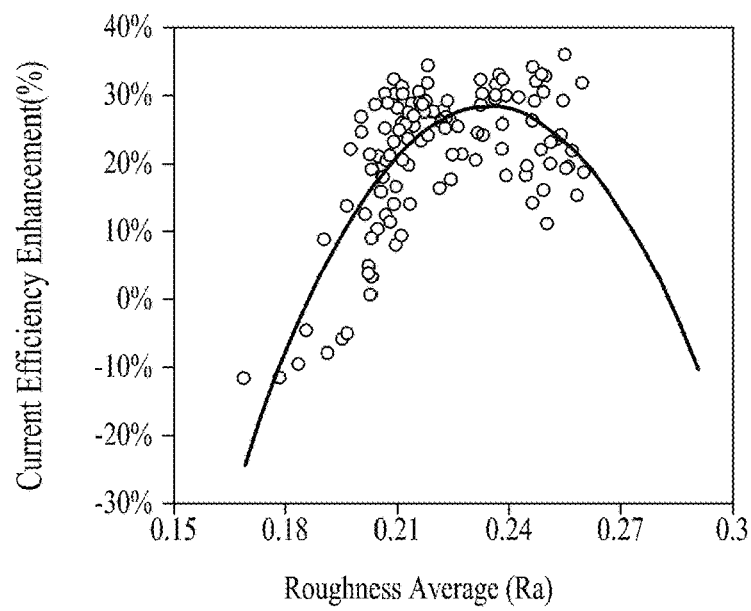
FIG. 10 is a graph illustrating current efficiency enhancement according to roughness average of an uneven portion in a light emitting display apparatus according to the present disclosure.

FIG. 10 is a graph illustrating current efficiency enhancement according to roughness average of an uneven portion in a light emitting display apparatus according to the present disclosure.

As may be seen from FIG. 10, in the light emitting display apparatus according to the present disclosure, it is noted that current efficiency enhancement is reduced to a negative value when roughness average Ra value of the uneven portion is less than about 0.19 or exceeds about 0.29 but current efficiency enhancement is increased to a positive value when the roughness average Ra value of the uneven portion ranges from about 0.19 to about 0.29. Particularly, in the light emitting display apparatus according to the present disclosure, it is noted that current efficiency enhancement of about 20% or more is obtained when roughness average Ra value of the uneven portion ranges from about 0.21 to about 0.26. Therefore, in the light emitting display apparatus according to the present disclosure, roughness average Ra value of the uneven portion overlapped with the opening area of each pixel may range from about 0.19 to about 0.29, more preferably range from about 0.21 to about 0.26, whereby current efficiency may be enhanced at about 20% or more.

Additionally, referring to FIG. 6 again, in the light emitting display apparatus according to the present disclosure, a height $H_{4H/5}$ (h1+h2) between the extension line of ⅘ height 4H/5 extension line of the protruding portion 173 and the bottom surface BS of the concave portion 171 may range from about 0.66 micrometers to about 0.92 micrometers when the roughness average Ra value of the uneven portion ranges from about 0.19 to about 0.29.

Figure 11:
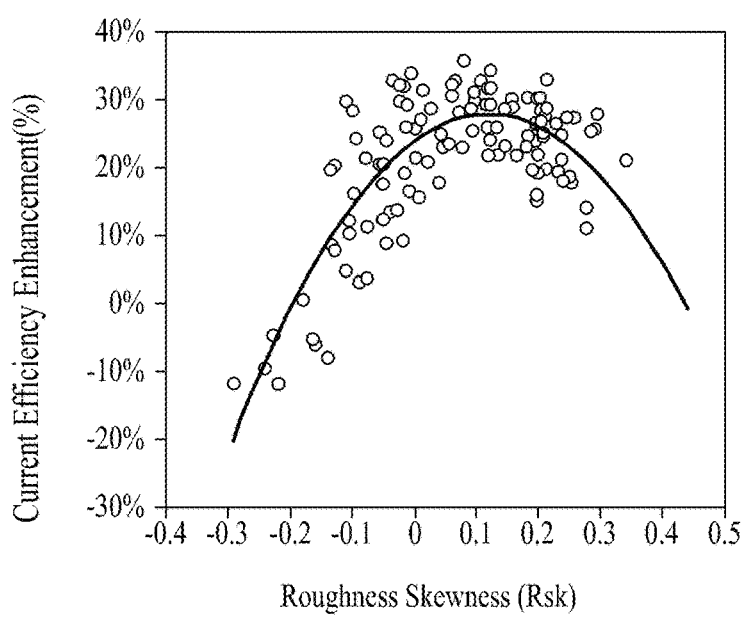
FIG. 11 is a graph illustrating an increase rate of current efficiency according to roughness skewness of an uneven portion in a light emitting display apparatus according to the present disclosure.

FIG. 11 is a graph illustrating an increase rate of current efficiency according to roughness skewness of a uneven portion in a light emitting display apparatus according to the present disclosure.

As may be seen from FIG. 11, in the light emitting display apparatus according to the present disclosure, it is noted that current efficiency enhancement is reduced to a negative value when roughness skewness Rsk value of the uneven portion 170 is less than about −0.2 or exceeds about 0.43 but current efficiency enhancement is increased to a positive value when the roughness skewness Rsk value of the uneven portion ranges from about −0.2 to about 0.43. Particularly, in the light emitting display apparatus according to the present disclosure, it is noted that current efficiency enhancement of about 20% or more is obtained when roughness skewness Rsk value of the uneven portion ranges from about −0.05 to about 0.28. Therefore, in the light emitting display apparatus according to the present disclosure, the roughness skewness Rsk value of the uneven portion overlapped with the opening area of each pixel may range from about −0.2 to about 0.43, more preferably range from about −0.05 to about 0.28, whereby current efficiency may be enhanced at about 20% or more.

Additionally, referring to FIG. 6 again, in the light emitting display apparatus according to the present disclosure, a distance $L_{4H/5}$ between a pair of single connection portions SCP parallel with each other by interposing the concave portion 171 may range from about 3.88 micrometers to about 4.35 micrometers based on ⅘ height 4H/5 when the a pitch P (see FIG. 4) of the protruding portion 173 is about 4.84 micrometers and roughness skewness Rsk value of the uneven portion ranges from about −0.2 to about 0.43.

Figure 12:
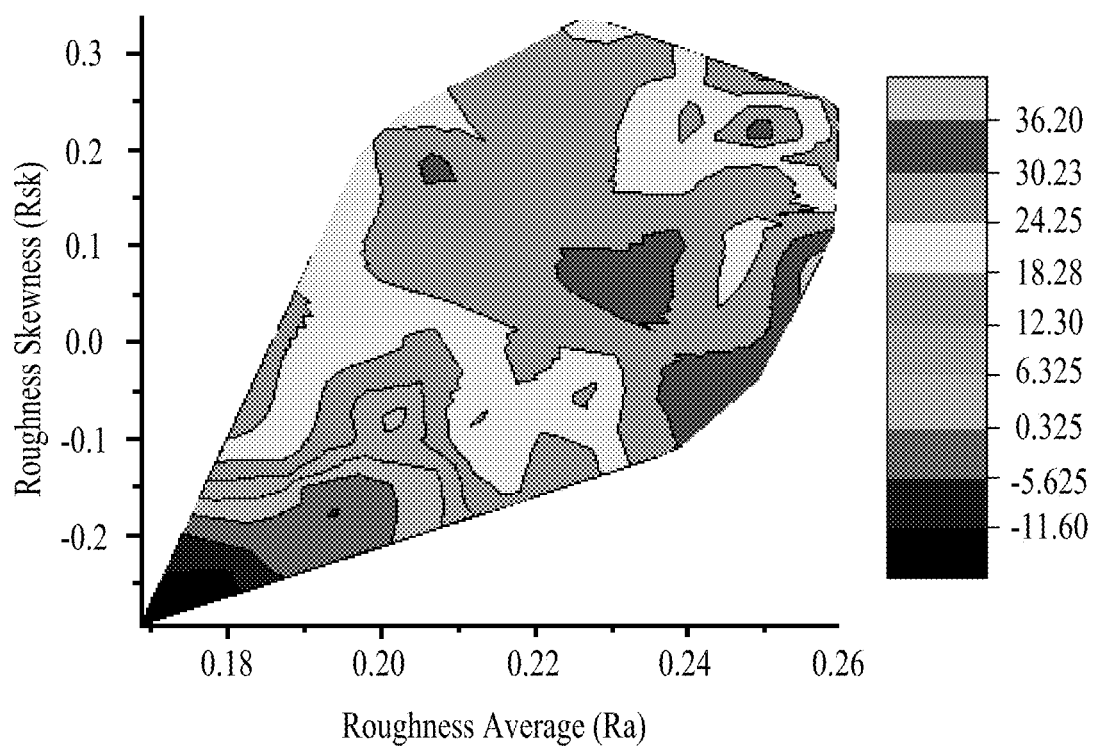
FIG. 12 is a graph illustrating current efficiency distribution depending on roughness average and roughness skewness an uneven portion in a light emitting display apparatus according to the present disclosure.

FIG. 12 is a graph illustrating current efficiency distribution depending on roughness average and roughness skewness an uneven portion in a light emitting display apparatus according to the present disclosure.

As may be seen from FIG. 12, in the light emitting display apparatus according to the present disclosure, it is noted that an enhancement area and a non-enhancement area of current efficiency are distributed respectively for each of roughness average Ra value of the uneven portion and roughness skewness Rsk value of the uneven portion. Particularly, in the light emitting display apparatus according to the present disclosure, it is noted that an enhancement area and a non-enhancement area of current efficiency are distributed in proportion to each of roughness average Ra value of the uneven portion and roughness skewness Rsk value of the uneven portion. For example, in the light emitting display apparatus according to the present disclosure, it is noted that current efficiency is enhanced as compared with the light emitting display apparatus of the related art, which does not include a uneven portion, when roughness average Ra value of the uneven portion ranges from about 0.19 to about 0.29 and roughness skewness Rsk value of the uneven portion ranges from about −0.2 to about 0.43. Particularly, in the light emitting display apparatus according to the present disclosure, it is noted that current efficiency is enhanced at about 20% or more as compared with the light emitting display apparatus of the related art, which does not include a uneven portion, when roughness average Ra value of the uneven portion ranges from about 0.21 to about 0.26 and roughness skewness Rsk value of the uneven portion ranges from about −0.05 to about 0.28.

The light emitting display apparatus according to the present disclosure may be described as follows.

The light emitting display apparatus according to one embodiment of the present disclosure may comprise a substrate including a plurality of pixel areas having an opening area, an uneven portion arranged in the opening area, and a light emitting diode arranged over the uneven portion, wherein the uneven portion may have roughness average of about 0.19 to about 0.29 for a unit size.

The light emitting display apparatus according to one embodiment of the present disclosure may further comprise an overcoat layer provided over the substrate and including the uneven portion, the uneven portion may include a plurality of concave portions spaced apart from each other, and a plurality of protruding portions between the plurality of concave portions.

According to one embodiment of the present disclosure, the protruding portion may include multi-connection portions provided among three neighboring concave portions, and a single connection portion connected to each of two neighboring multi-connection portions between two neighboring concave portions and having a height lower than the multi-connection portions.

According to one embodiment of the present disclosure, the multi-connection portion may include a highest peak portion of a cutting edge structure, a slope surface provided between the highest peak portion and a bottom surface of the concave portion, and a ridge portion provided between the highest peak portion and the single connection portion, the ridge portion may concave between two neighboring multi-connection portions with the single connection portion interposed therebetween, or the ridge portion includes a ridge bottom surface corresponding to a middle of the single connection portion, or an angle between the highest peak portion and ridge bottom surface is equal to or greater than 15 degrees and less than 75 degrees.

According to one embodiment of the present disclosure, the light emitting diode may include a first electrode arranged over the uneven portion, a light emitting layer provided over the first electrode, and a second electrode provided over the light emitting layer, the first electrode may be formed to be conformal with respect to the uneven portion, and the light emitting layer may be formed to be non-conformal with respect to the first electrode.

According to one embodiment of the present disclosure, the light emitting layer may include a non-effective emission area overlapped with the bottom surface of each of the plurality of concave portions, a first effective emission area overlapped with the single connection portion between the two neighboring multi-connection portions, and a second effective emission area overlapped with the multi-connection portions arranged among three neighboring concave portions and having luminance higher than that of the first effective emission area.

According to one embodiment of the present disclosure, the uneven portion may have roughness skewness of about −0.2 to about 0.43 for a unit size.

A light emitting display apparatus according to one embodiment of the present disclosure may comprise an overcoat layer provided over a substrate, including an uneven portion having a plurality of protruding portions, a first electrode provided over the uneven portion, a light emitting layer provided over the first electrode, and a second electrode provided over the light emitting layer, wherein the uneven portion may have roughness skewness of about −0.2 to about 0.43 for a unit size.

According to one embodiment of the present disclosure, the first electrode may have a contour which conforms to a contour of the plurality of protruding portions, and the light emitting layer may have a contour which does not conform to the contour of the plurality of protruding portions.

According to one embodiment of the present disclosure, the uneven portion may further include a plurality of concave portions surrounded by the plurality of protruding portions, and the protruding portion may include multi-connection portions provided among three neighboring concave portions, and a single connection portion connected to each of two neighboring multi-connection portions between two neighboring concave portions and having a height lower than the multi-connection portions.

According to one embodiment of the present disclosure, the light emitting layer may include a non-effective emission area overlapped with a bottom surface of each of the plurality of concave portions, a first effective emission area overlapped with the single connection portion between the two neighboring multi-connection portions, and a second effective emission area overlapped with the multi-connection portions arranged among three neighboring concave portions and having luminance higher than that of the first effective emission area.

According to one embodiment of the present disclosure, the uneven portion may have roughness average of about 0.19 to about 0.29 for a unit size.

A light emitting display apparatus according to one embodiment of the present disclosure may comprise a substrate including a plurality of pixel areas having an opening area, an overcoat layer provided in the opening area and having an uneven portion including a plurality of concave portions spaced apart from each other and a plurality of protruding portions among the plurality of concave portions, a first electrode provided over the uneven portion, a light emitting layer provided over the first electrode, and a second electrode provided over the light emitting layer, wherein the uneven portion may have at least one of roughness average of about 0.19 to about 0.29 and roughness skewness of about −0.2 to about 0.43 for a unit size.

According to one embodiment of the present disclosure, the protruding portion may include multi-connection portions provided among three neighboring concave portions, and a single connection portion connected to each of two neighboring multi-connection portions between two neighboring concave portions and having a height lower than the multi-connection portions.

According to one embodiment of the present disclosure, the opening area may include a non-effective emission area overlapped with a bottom surface of each of the plurality of concave portions, a first effective emission area overlapped with the single connection portion between the two neighboring multi-connection portions, and a second effective emission area overlapped with the multi-connection portions arranged among three neighboring concave portions and having luminance higher than that of the first effective emission area.

According to one embodiment of the present disclosure, the first electrode may be formed conformally for the uneven portion, and the light emitting layer may be formed non-conformally for the first electrode.

According to one embodiment of the present disclosure, the protruding portion may further include a ridge portion provided to be concave between two neighboring multi-connection portions.

According to one embodiment of the present disclosure, the light emitting layer may have a thickness gradually increased toward the bottom surface of each of the plurality of concave portions.

According to one embodiment of the present disclosure, the protruding portion may have a hexagonal shape or a honeycomb structure in plan view.

According to one embodiment of the present disclosure, the plurality of concave portions may be arranged in a line along the first direction and staggered along the second direction.

A light emitting display apparatus according to one embodiment of the present disclosure may further comprise a bank layer disposed over an edge of the uneven portion, and a color filter disposed between the substrate and the uneven portion.

According to one embodiment of the present disclosure, an edge of the color filter may be extended beyond an edge of the uneven portion toward below the bank layer, or wherein an edge of the color filter, an edge of the uneven portion, and an edge of the bank layer may overlap each other in a non-opening area, or the bank layer may overlay the edge of the uneven portion.

According to one embodiment of the present disclosure, each of the plurality of pixel areas may further include a non-opening area surrounding the opening area, a boundary between the opening area and the non-opening area may overlap with a portion of uneven portion.

According to one embodiment of the present disclosure, the single connection portion may include a peak portion and a first curved portion provided to be concave between a bottom surface of the protruding portion and the peak portion, and the first curved portion has a maximum tangent slope at an upper portion of the single connection portion.

According to one embodiment of the present disclosure, the tangent slope of the first curved portion may be gradually increased from a ⅘-height position to the peak portion of the single connection portion.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus, comprising:
    a substrate including a plurality of pixel areas having an opening area;
    an overcoat layer provided on the substrate and including an uneven portion arranged in the opening area; and
    a light emitting diode arranged over the uneven portion,
    wherein an average value for a height of the uneven portion for a unit size is about 0.19 micrometers to about 0.29 micrometers, wherein a skewness value of the uneven portion for a unit size is about −0.2 to about 0.43, wherein the uneven portion includes a plurality of concave portions spaced apart from each other, and a plurality of protruding portions between the plurality of concave portions, and wherein the skewness value of the uneven portion is a symmetrical level for hill and valley based on an average line as a center line of the plurality of protruding portions.

2. The light emitting display apparatus of claim 1, wherein the protruding portion includes:
   two multi-connection portions each provided among three neighboring concave portions; and
   a single connection portion connected to the two multi-connection portions, and positioned between two neighboring concave portions, and having a height lower than those of the multi-connection portions.

3. The light emitting display apparatus of claim 2, wherein a multi-connection portion of the two multi-connection portion includes:
   a peak portion;
   a slope surface provided between the peak portion and a bottom surface of the concave portion; and
   a ridge portion provided between the peak portion and the single connection portion,
   wherein the ridge portion is concave, and is positioned between the two multi-connection portions with the single connection portion interposed therebetween, or
   wherein the ridge portion includes a ridge bottom surface corresponding to a middle of the single connection portion, or
   wherein an angle between the highest peak portion and ridge bottom surface is equal to or greater than 15 degrees and less than 75 degrees.

4. The light emitting display apparatus of claim 2, wherein the light emitting diode includes:
   a first electrode arranged over the uneven portion;
   a light emitting layer provided over the first electrode; and
   a second electrode provided over the light emitting layer,
   wherein the first electrode is formed to be conformal with respect to the uneven portion, and the light emitting layer is formed to be non-conformal with respect to the first electrode.

5. The light emitting display apparatus of claim 4, wherein the light emitting layer includes:
   a non-effective emission area overlapping with the bottom surface of each of the plurality of concave portions;
   a first effective emission area overlapping with the single connection portion between the two neighboring multi-connection portions; and
   a second effective emission area overlapping with the multi-connection portions arranged among three neighboring concave portions and having luminance higher than that of the first effective emission area.

6. A light emitting display apparatus, comprising:
   an overcoat layer provided over a substrate and including an uneven portion having a plurality of protruding portions;
   a first electrode provided over the uneven portion;
   a light emitting layer provided over the first electrode; and
   a second electrode provided over the light emitting layer,
   wherein a skewness value of the uneven portion for a unit size is about −0.2 to about 0.43, and wherein the skewness value of the uneven portion is a symmetrical level for hill and valley based on an average line as a center line of the plurality of protruding portions.

7. The light emitting display apparatus of claim 6,
   wherein the first electrode has a contour which conforms to a contour of the plurality of protruding portions, and
   wherein the light emitting layer has a contour which does not conform to the contour of the plurality of protruding portions.

8. The light emitting display apparatus of claim 6, wherein an average value for a height of the plurality of protruding portions for a unit size is about 0.19 micrometers to about 0.29 micrometers, or
   wherein the uneven portion further includes a plurality of concave portions surrounded by the plurality of protruding portions.

9. The light emitting display apparatus of claim 6, wherein the uneven portion further includes a plurality of concave portions surrounded by the plurality of protruding portions, and
   wherein the protruding portion includes:
      multi-connection portions provided among three neighboring concave portions; and
      single connection portions each connected to two neighboring multi-connection portions, and positioned between two neighboring concave portions, and having a height lower than those of the multi-connection portions.

10. The light emitting display apparatus of claim 9, wherein the light emitting layer includes:
    a non-effective emission area overlapping with a bottom surface of each of the plurality of concave portions;
    a first effective emission area overlapping with the single connection portions; and
    a second effective emission area overlapping with the multi-connection portions and having luminance higher than that of the first effective emission area.

11. A light emitting display apparatus, comprising:
    a substrate including a plurality of pixel areas having an opening area;
    an overcoat layer provided in the opening area and having an uneven portion, the uneven portion including a plurality of concave portions spaced apart from each other and a plurality of protruding portions among the plurality of concave portions;
    a first electrode provided over the uneven portion;
    a light emitting layer provided over the first electrode; and
    a second electrode provided over the light emitting layer,
    wherein a skewness value of the uneven portion for a unit size is about −0.2 to about 0.43, and wherein the skewness value of the uneven portion is a symmetrical level for hill and valley based on an average line as a center line of the plurality of protruding portions.

12. The light emitting display apparatus of claim 11, wherein the protruding portion includes:
    multi-connection portions each provided among three neighboring concave portions; and
    single connection portions each connected to two neighboring multi-connection portions, positioned between two neighboring concave portions, and having a height lower than those of the multi-connection portions.

13. The light emitting display apparatus of claim 12, wherein the opening area includes:
    a non-effective emission area overlapping with a bottom surface of each of the plurality of concave portions;

a first effective emission area overlapping with the single connection portion between the two neighboring multi-connection portions; and a second effective emission area overlapping with the multi-connection portions arranged among three neighboring concave portions and having luminance higher than that of the first effective emission area.

14. The light emitting display apparatus of claim 11, wherein the first electrode is formed conformally with respect to the uneven portion, and the light emitting layer is formed non-conformally with respect to the first electrode.

15. The light emitting display apparatus of claim 12, wherein the protruding portion further includes a ridge portion provided to be concave between two neighboring multi-connection portions.

16. The light emitting display apparatus of claim 11, wherein the light emitting layer has a thickness gradually increased toward the bottom surface of each of the plurality of concave portions.

17. The light emitting display apparatus of claim 11,
wherein the protruding portion has a hexagonal shape or a honeycomb structure in plan view, or
wherein the plurality of concave portions are arranged in a line along a first direction and staggered along a second direction.

18. The light emitting display apparatus of claim 11, further comprising:
a bank layer disposed over an edge of the uneven portion; and
a color filter disposed between the substrate and the uneven portion,
wherein an edge of the color filter extends beyond the edge of the uneven portion toward below the bank layer, or
wherein an edge of the color filter, the edge of the uneven portion, and an edge of the bank layer overlap one another in a non-opening area surrounding the opening area, or
wherein the bank layer overlays the edge of the uneven portion.

19. The light emitting display apparatus of claim 11, wherein each of the plurality of pixel areas further includes a non-opening area surrounding the opening area,
wherein a boundary between the opening area and the non-opening area overlaps with a portion of uneven portion.

20. The light emitting display apparatus of claim 11, wherein an average value for a height of the uneven portion for a unit size is about 0.19 micrometers to about 0.29 micrometers.

* * * * *